(12) United States Patent
Numata

(10) Patent No.: US 9,998,691 B2
(45) Date of Patent: Jun. 12, 2018

(54) PIXEL, A SOLID-STATE IMAGING DEVICE, AND AN IMAGING APPARATUS HAVING BARRIER REGION BETWEEN PHOTOELECTRIC CONVERSION PORTIONS IN PARALLEL

(71) Applicant: CANON KABUSHIKI KAISHA, Tokyo (JP)

(72) Inventor: Aihiko Numata, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 71 days.

(21) Appl. No.: 15/065,531

(22) Filed: Mar. 9, 2016

(65) Prior Publication Data

US 2016/0269655 A1    Sep. 15, 2016

(30) Foreign Application Priority Data

Mar. 11, 2015   (JP) .................................. 2015-048506
Feb. 2, 2016    (JP) .................................. 2016-018366

(51) Int. Cl.
*H04N 3/14*      (2006.01)
*H04N 5/335*     (2011.01)
(Continued)

(52) U.S. Cl.
CPC ......... *H04N 5/355* (2013.01); *H01L 27/1461* (2013.01); *H01L 27/1463* (2013.01);
(Continued)

(58) Field of Classification Search
CPC ...... H04N 5/359; H04N 5/3559; H04N 5/378; H04N 5/3696; H04N 5/23212;
(Continued)

(56) References Cited

U.S. PATENT DOCUMENTS

| | | |
|---|---|---|
| 6,819,360 B1 | 11/2004 | Ide et al. |
| 2012/0300104 A1 | 11/2012 | Onuki et al. |
| 2013/0214128 A1* | 8/2013 | Yamashita ........ H01L 27/14609 250/208.1 |
| 2013/0235253 A1* | 9/2013 | Onuki .................. H04N 5/3696 348/349 |

(Continued)

FOREIGN PATENT DOCUMENTS

| | | |
|---|---|---|
| EP | 2565925 A2 | 3/2013 |
| JP | 2002314062 A | 10/2002 |

(Continued)

*Primary Examiner* — Kelly L Jerabek
(74) *Attorney, Agent, or Firm* — Canon U.S.A., Inc. IP Division

(57) ABSTRACT

A solid-state imaging device is provided in which ranging signals can be acquired while acquiring imaging signals having different sensitivities from each other, and also preventing ranging precision from deteriorating. A pixel includes a first photoelectric conversion region and a second photoelectric conversion region that have different sensitivities from each other and are arrayed in parallel in a first direction, and a first barrier region that is sandwiched between the first photoelectric conversion region and the second photoelectric conversion region. The first photoelectric conversion region includes a first photoelectric conversion portion and a second photoelectric conversion portion arrayed in parallel in a second direction that intersects the first direction, and a second barrier region sandwiched between the first photoelectric conversion portion and the second photoelectric conversion portion. A magnitude of electrical separation of the first barrier region is larger than a magnitude of electrical separation of the second barrier region.

23 Claims, 17 Drawing Sheets

(51) Int. Cl.
*H04N 5/355* (2011.01)
*H01L 27/146* (2006.01)
*H04N 1/21* (2006.01)
*H04N 5/225* (2006.01)
*H04N 5/232* (2006.01)
*H04N 5/235* (2006.01)

(52) U.S. Cl.
CPC .. *H01L 27/14605* (2013.01); *H01L 27/14607* (2013.01); *H01L 27/14625* (2013.01); *H01L 27/14627* (2013.01); *H01L 27/14643* (2013.01); *H04N 1/212* (2013.01); *H04N 5/2254* (2013.01); *H04N 5/2355* (2013.01); *H04N 5/23245* (2013.01); *H04N 2201/0084* (2013.01)

(58) Field of Classification Search
CPC .. H04N 5/23232; H04N 5/3415; H04N 5/343; H04N 3/1593; G02B 7/28; G02B 7/34
See application file for complete search history.

(56) References Cited

U.S. PATENT DOCUMENTS

| | | | |
|---|---|---|---|
| 2014/0022354 A1* | 1/2014 | Okigawa | H04N 5/347 348/46 |
| 2014/0146197 A1 | 5/2014 | Okuzawa et al. | |
| 2014/0152878 A1* | 6/2014 | Ozawa | H01L 27/14621 348/273 |
| 2014/0204251 A1* | 7/2014 | Ishida | H04N 5/23212 348/294 |

FOREIGN PATENT DOCUMENTS

| | | |
|---|---|---|
| JP | 2004120391 A | 4/2004 |
| JP | 2004363193 A | 12/2004 |
| JP | 2007158692 A | 6/2007 |
| JP | 2014165778 A | 9/2014 |
| WO | 2007011026 A1 | 1/2007 |
| WO | 2015/015790 A1 | 2/2015 |

\* cited by examiner

PIXEL, A SOLID-STATE IMAGING DEVICE, AND AN IMAGING APPARATUS HAVING BARRIER REGION BETWEEN PHOTOELECTRIC CONVERSION PORTIONS IN PARALLEL

BACKGROUND OF THE INVENTION

Field of the Invention

The present invention relates to a solid-state imaging device, and more particularly relates to a solid-state imaging device suitable for an imaging apparatus such as a digital camera.

Description of the Related Art

There is increased demand for wider dynamic ranges in images acquired by imaging apparatuses such as digital cameras. Japanese Patent Laid-Open No. 2004-363193 proposes a technology to deal with this issue by differentiating the aperture area of multiple photoelectric conversion portions within a pixel from each other, changing the ratio of the amount of light entering the photoelectric conversion portions, thereby acquiring the types of pixel signals; high-sensitivity signals and low-sensitivity signals. These are then synthesized, widening the dynamic range.

There is also increased demand for realization of an imaging apparatus that can acquire still image signals while acquiring moving image signals. Generally, in order to obtain smooth moving images, shooting is preferably performed at an exposure time (charge accumulation period) around the same as the readout frame rate of the solid-state imaging device. On the other hand, the exposure time in the case of still images is preferably set according to the motion speed of the subject. Accordingly, acquiring still image signals while acquiring moving image signals necessitates acquisition of two image signals that each have different exposure times.

Japanese Patent Laid-Open No. 2004-120391 discloses a solid-state imaging device that has multiple photoelectric conversion elements (equivalent to the photoelectric conversion portions in Japanese Patent Laid-Open No. 2004-363193) having different exposure times in a single pixel, to acquire still image signals while acquiring moving image signals. The area of the photoelectric conversion element having a relatively short exposure time is relatively wide, while the area of the photoelectric conversion element having a relatively long exposure time is relatively small, and the sensitivity differs between the photoelectric conversion element for moving images and the photoelectric conversion element for still images. Note that "sensitivity of [the] photoelectric conversion element (photoelectric conversion portion)" is defined as the proportion of the amount of electric charges accumulated in the photoelectric conversion portion as to the amount of light entering the pixel per unit of time.

Japanese Patent Laid-Open No. 2002-314062 discloses a solid-state imaging device that has distance-measuring pixels (hereinafter referred to as "ranging pixels") having ranging functions to detect the distance to a subject by phase-difference measurement, as conventional art. A ranging pixel is provided with multiple photoelectric conversion portions, and is configured such that light beams which have passed through different regions of the pupil of the photographing lens are each guided to different photoelectric conversion portions. Images of light beams, which have each passed through the pupil region shifted away from the optical axis of the photographing lens to opposite sides from each other (hereinafter referred to as "ranging image") are generated from the signals acquired by each of the multiple photoelectric conversion portions provided to each ranging pixel. The distance to the subject can then be detected using the principle of triangulation, based on the amount of misalignment between the ranging images generated from each of the light beams that have passed through different pupil regions of the photographing lens. When imaging, the outputs of signals acquired at the multiple photoelectric conversion portions within the pixel are added and acquired, thereby yielding imaging signals.

Now, when acquiring ranging images while acquiring images of different sensitivities the following problem occurs. In order to acquire one of multiple imaging signals having different sensitivities while acquiring another, using the techniques disclosed in Japanese Patent Laid-Open Nos. 2004-363193 and 2004-120391, the amount of light entering each of the multiple photoelectric conversion portions provided within the pixel needs to be changed. Specifically, a configuration is employed where two photoelectric conversion portions are provided in the pixel, and the optical axis of the microlens is shifted away from the center of a barrier region for separating the two photoelectric conversion portions. However, this layout results in a shorter distance (baseline length) between pupil regions of the photographing lens through which the light beams received by the photoelectric conversion portions pass, and the precision of ranging deteriorates.

On the other hand, in a case where the optical axes of microlenses passes through the center of a barrier region for separating the two photoelectric conversion portions, as in the case of Japanese Patent Laid-Open No. 2002-314062, the distance (baseline length) between pupil regions of the photographing lens through which the light beams received by the photoelectric conversion portions pass is longer, so the precision of ranging improves. However, the amounts of light entering the two photoelectric conversion portions through the microlens are approximately the same, so acquiring one of multiple imaging signals having different sensitivities while acquiring another becomes difficult.

It has been found desirable to enable ranging signals (signals for acquiring ranging images) to be acquired while acquiring imaging signals (signals for acquiring images) having different sensitivities from each other, and also preventing ranging precision from deteriorating.

SUMMARY OF THE INVENTION

A pixel includes a first photoelectric conversion region and a second photoelectric conversion region that have different sensitivities from each other and are arrayed in parallel in a first direction, and a first barrier region that is sandwiched between the first photoelectric conversion region and the second photoelectric conversion region. The first photoelectric conversion region includes a first photoelectric conversion portion and a second photoelectric conversion portion arrayed in parallel in a second direction that intersects the first direction, and a second barrier region sandwiched between the first photoelectric conversion portion and the second photoelectric conversion portion. A magnitude of electrical separation of the first barrier region is larger than a magnitude of electrical separation of the second barrier region. An imaging apparatus according to the present invention includes a photographing lens and the solid-state imaging device.

Further features of the present invention will become apparent from the following description of exemplary embodiments with reference to the attached drawings.

DESCRIPTION OF THE EMBODIMENTS

Figure 1:
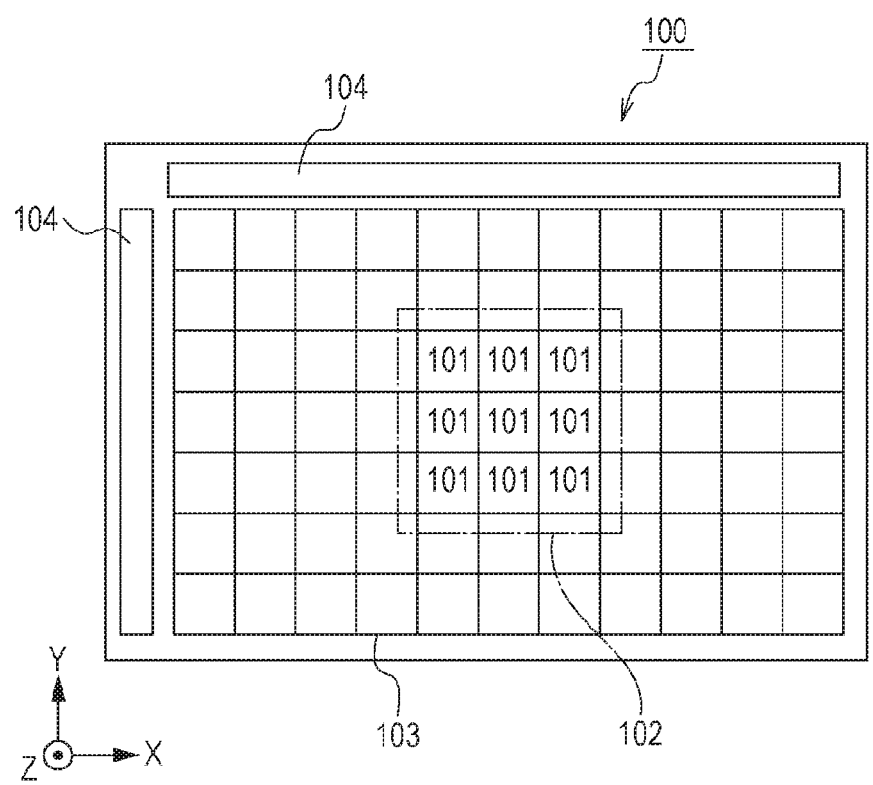
FIG. 1 is a diagram illustrating an example of a solid-state imaging device according to a first embodiment.

Embodiments of a solid-state imaging device according to the present invention will be described with reference to the drawings. Portions which have the same or equivalent functions throughout the drawings are denoted by the same reference numerals, and redundant description will be omitted.

First Embodiment

The configuration of a solid-state imaging device that is capable of acquiring ranging signals and signals for multiple images having different sensitivities at the same time will be described. FIG. 1 is a schematic diagram illustrating an example of a solid-state imaging device 100 according to the present invention. The solid-state imaging device 100 has an imaging region 103 where pixels are provided, and a region where peripheral circuits 104 are disposed.

Pixels 101 are pixels arrayed in a center region 102 of the imaging region 103. The term "pixels arrayed in a center region 102" is used meaning pixels of which the center of gravity of the pixel 101 is included within the center region 102, when viewed from a direction perpendicular to the imaging region 103 (Z direction). The center region 102 is a region of which the distance from the center of the solid-state imaging device 100 is a predetermined value or smaller. The predetermined value preferably is ¼ the length of the diagonal lines of the imaging region 103 or smaller, and further preferably is 1/20 the length of the diagonal lines or smaller.

Although FIG. 1 illustrates an example of a solid-state imaging device where 3 by 3 pixels 101 are arrayed in the center region 102, this array of pixels 101 is not restrictive; it is sufficient for multiple pixels 101 to be arrayed in the center region 102. The center region 102 may also contain pixels of different configurations from the pixels 101, besides the pixels 101.

Figure 2A:
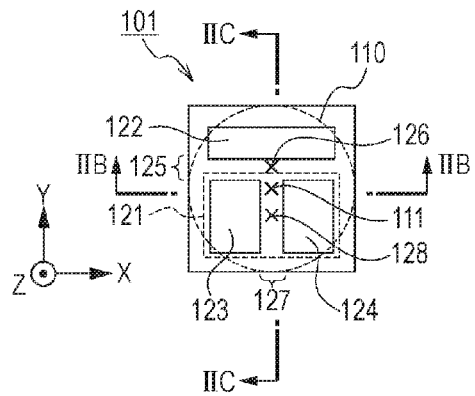
FIGS. 2A through 2E are diagrams illustrating a configuration example of a pixel according to the first embodiment, and an example of potential distribution provided in the pixel according to the first embodiment.
Figure 2B:
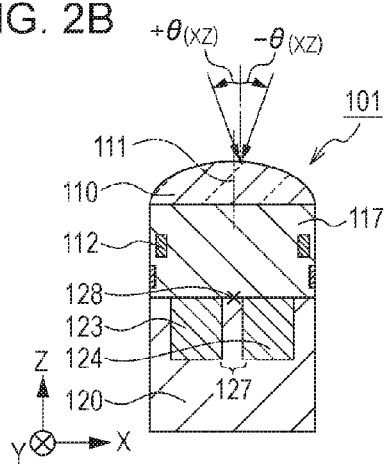
Figure 2C:
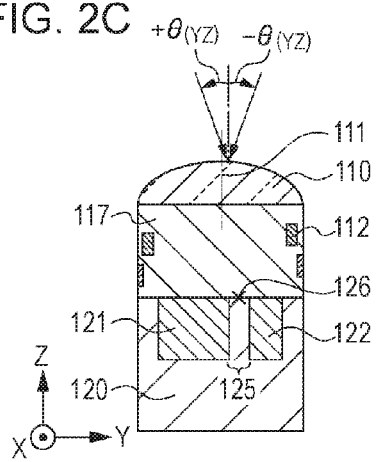

FIG. 2A is a diagram of the pixel 101 as viewed from the light entry side (X-Y plane). FIG. 2B is a cross-sectional view taken along IIB-IIB in FIG. 2A as viewed from the Y direction (X-Z cross-section), and FIG. 2C is a cross-sectional view taken along IIC-IIC in FIG. 2A as viewed from the X direction (X-Z cross-section). The pixel 101 has a microlens 110 and a substrate 120, in that order from the light entry side. In other words, the pixel 101 has the microlens 110 on the light entry side of the substrate 120. The substrate 120 has provided thereupon a first photoelectric conversion region 121 and a second photoelectric conversion region 122, and a first barrier region 125 sandwiched between the first photoelectric conversion region 121 and second photoelectric conversion region 122, arrayed in parallel in a first direction. The first direction in the case of FIGS. 2A through 2C matches the Y direction in which pixels 101 are arrayed in the lateral direction of the solid-state imaging device 100.

Further, in the first photoelectric conversion region 121, the substrate 120 has provided thereupon a first photoelectric conversion portion 123 and a second photoelectric conversion portion 124, and a second barrier region 127 sandwiched between the first photoelectric conversion portion 123 and second photoelectric conversion portion 124, arrayed in parallel in a second direction that intersects the first direction. The second direction in the case of FIGS. 2A through 2C matches the X direction in which pixels 101 are arrayed in the longitudinal direction of the solid-state imaging device 100. The second photoelectric conversion region 122 is formed as a single photoelectric conversion portion (also denoted by reference numeral "122").

Lines 112 are provided within the pixel 101, for setting exposure time (charge accumulation time) for each photoelectric conversion portion, and for acquiring signals generated at the photoelectric conversion portions.

The photoelectric conversion portions 122, 123, and 124 are formed by forming a potential distribution on the substrate 120 of a material such as silicon that absorbs a wavelength band range to be detected, by ion implantation or the like. This potential distribution forms potential barriers, whereby a potential barrier is formed between the first photoelectric conversion region 121 and the second photoelectric conversion region 122, and becomes the first barrier region 125. In the same way, a potential barrier is formed between the first photoelectric conversion portion 123 and second photoelectric conversion portion 124, and becomes the second barrier region 127.

Figure 2D:
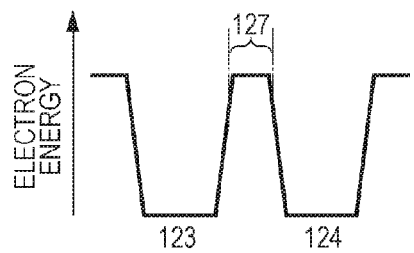
Figure 2E:
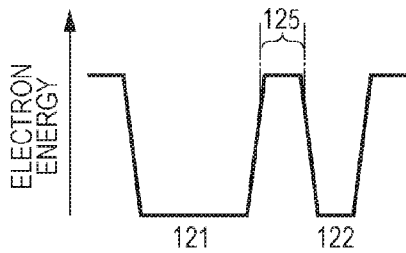

FIG. 2D illustrates the potential distribution at the cross-section in FIG. 2B, and FIG. 2E illustrates the potential distribution at the cross-section in FIG. 2C. A region that includes the highest value of the potential barrier formed between the photoelectric conversion portions and has a magnitude of 90% or more of the highest value of the potential barrier corresponds to the barrier region, as illustrated in FIGS. 2D and 2E.

The potential distribution may be formed in the pixel by implanting ions in regions corresponding to barrier regions, rather than regions corresponding to photoelectric conversion portions. Alternatively, both photoelectric conversion portions and barrier regions may be subjected to ion implantation. In this case, the barrier regions are preferably implanted with ions having opposite conductivity to the ions implanted in the regions corresponding to the photoelectric conversion portions.

The planar shapes of the photoelectric conversion regions and photoelectric conversion portions are not restricted to be rectangular as illustrated in FIG. 2A, and may be circles, ellipses, polygons, or the like. Polygons may have the corners rounded in the manufacturing process.

The microlens 110 is provided to improve light collection efficiency of incident light to the pixel 101, and to distribute the incident light to the photoelectric conversion portions. Examples of the material of the microlens 110 include silicon oxide, silicon nitride, silicon oxynitride, silicon carbide, borophosphosilicate glass (BPSG), and like inorganic materials, polymers, resins, and like organic materials, and mixtures thereof.

The optical axis 111 of the microlens 110 is offset from the center 126 of the first barrier region 125, toward the first photoelectric conversion region 121 side (−Y direction). The direction of offset toward the center 126 of the first barrier region 125 is, as viewed from the center 128 of the second barrier region 127, is in the Y direction. That is to say, the optical axis 111 of the microlens 110 is not offset in the second direction (X direction) as to the center 126 of the first barrier region 125 or the center 128 of the second barrier region 127. The term "not offset" here tolerates offset in the order of the margin of manufacturing error. Specifically, offset around 5% of the width of the pixel 101 in the second direction is tolerated. Also, "the center of the first barrier region" is used to mean the same as "the center of gravity of the region sandwiched between the first photoelectric conversion region and the second photoelectric conversion region", and means the center of gravity of the shape of the first barrier region 125 on the surface of the substrate 120 in plan view from the Z direction. This also is true for "the center of the second barrier region".

As described above, the optical axis 111 of the microlens 110 is not offset in the X direction as to the center 128 of the second barrier region 127, in the solid-state imaging device 100 illustrated in FIGS. 2A through 2C. Accordingly, light is received at the first photoelectric conversion portion 123 and second photoelectric conversion portion 124 through pupil regions offset in opposite directions (+X direction and −X direction) as to the optical axis of the photographing lens, and electric signals are acquired. Calculating the offset amount between the ranging image generated from electric signals acquired at the first photoelectric conversion portion 123 and ranging image generated from electric signals acquired at the second photoelectric conversion portion 124 enables the distance to the subject to be detected. That is to say, signals acquired at each of the first photoelectric conversion portion 123 and the second photoelectric conversion portion 124 can be used as ranging signals.

The amount of light entering the first photoelectric conversion region 121 is larger than the amount of light entering the second photoelectric conversion region 122, since the optical axis 111 of the microlens 110 is offset toward the first photoelectric conversion region 121 from the center 126 of the first barrier region 125. That is to say, the sensitivity of the first photoelectric conversion region 121 is better than the sensitivity of the second photoelectric conversion region 122. Accordingly, the electric signals generated at the first photoelectric conversion region 121, which is to say the sum of electric signals generated at the first photoelectric conversion portion 123 and second photoelectric conversion portion 124, can be used as high-sensitivity signals, and the electric signals generated at the second photoelectric conversion region 122 can be used as low-sensitivity signals.

Thus, the second direction (X direction) in which the photoelectric conversion portions for acquiring ranging signals are disposed, and the first direction (Y direction) in which the photoelectric conversion region for acquiring signals having different sensitivities is disposed, intersect. This enables a solid-state imaging device to be realized in which signals necessary for ranging and multiple signals with different sensitivities necessary for imaging, can be acquired at the same time.

Figure 13A:
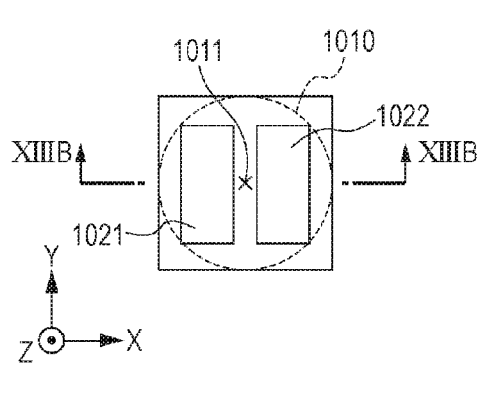
FIGS. 13A through 13C are diagrams illustrating a configuration example of a pixel in a solid-state imaging device according to a comparative example, and the relationship between sensitivity of photoelectric conversion members provided to the pixels and the amount of shift of an optical axis of a microlens.
Figure 13B:
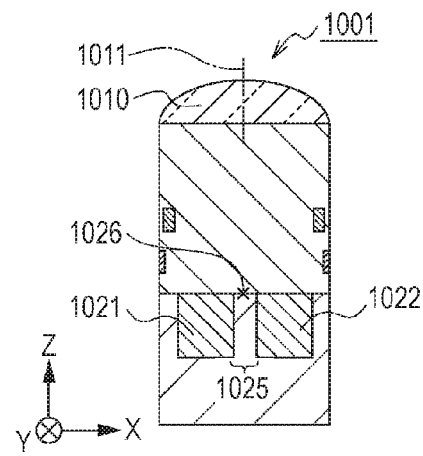

Next, the present embodiment will be described in detail, while making comparison with a conventional solid-state imaging device. FIG. 13A is a configuration example of a pixel 1001 of a solid-state imaging device illustrated for comparison. FIG. 13A is a layout of the pixel 1001 as viewed from the light entry side, and FIG. 13B is a cross-sectional view taken along line XIIIB-XIIIB in FIG. 13A, as viewed from the Y side (X-Z cross-section). The pixel 1001 has a first photoelectric conversion portion 1021, a second photoelectric conversion portion 1022, a barrier region 1025, and a microlens 1010.

Figure 13C:
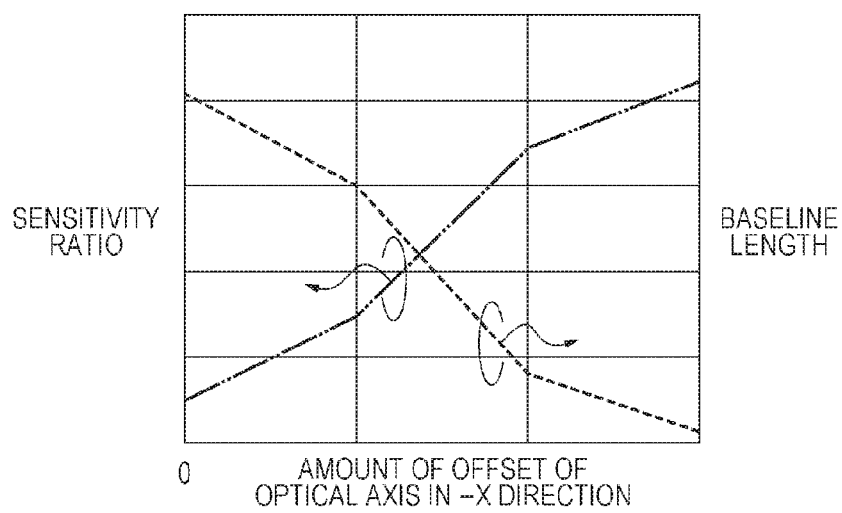

FIG. 13C illustrates the relationship between the amount of offset of the optical axis 1011 of the microlens 110 in the X direction as to the center 1026 of the barrier region 1025, and the sensitivity ratio of the first photoelectric conversion portion 1021 and second photoelectric conversion portion 1022 by a two-dot dashed line. The offset amount is zero where the optical axis 1011 of the microlens 110 passes through the center 1026 of the barrier region 1025. The amount of offset of the optical axis 1011 in the X direction as to the center 1026 of the barrier region 1025 can be easily adjusted by changing the width in the X direction of the apertures of the first photoelectric conversion region 1021 and second photoelectric conversion portion 1022 while maintaining the placement of the microlens 1010.

The sensitivity ratio is defined as (sensitivity of first photoelectric conversion portion 1021)/sensitivity of second photoelectric conversion portion 1022). The larger the sensitivity ratio is, the larger the difference between the sensitivity of first photoelectric conversion portion 1021 and the sensitivity of second photoelectric conversion portion 1022 is.

FIG. 13C also illustrates the relationship between the baseline length between the ranging image generated from signals acquired at the first photoelectric conversion portion 1021 and the ranging image generated from signals acquired at the second photoelectric conversion portion 1022, and the amount of offset of the optical axis 1011, but a dotted line. The baseline length corresponds to the difference in incident angles to the pixel regarding the light beams which each of the first photoelectric conversion portion 1021 and second photoelectric conversion portion 1022 receive. The longer the baseline length is, the more precise the ranging can be.

It can be seen from FIG. 13C that when the optical axis 1011 passes through the center 1026 of the barrier region 1025 (offset=0), the baseline length is long, but the sensitivity ratio is small. On the other hand, increasing the amount of offset to be larger at the first photoelectric conversion portion 1021 side (−X direction) than the center 1026 of the barrier region 1025 yields a larger sensitivity ratio, but the baseline length is short. As demonstrated here, the sensitivity ratio and baseline length are in a tradeoff relationship in conventional configurations.

Figure 14A:
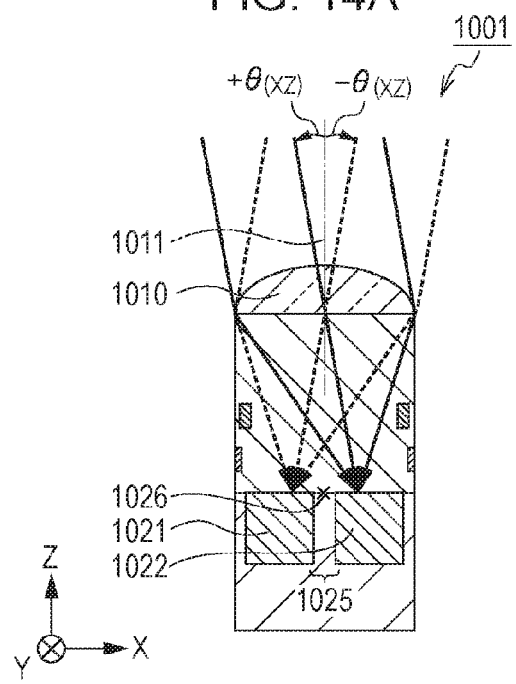
FIGS. 14A and 14B are diagrams illustrating the way incident light beams to a pixel are propagated, regarding each of a case where the amount of shift of the optical axis of the microlens is small and a case where the amount of shift is large.

This tradeoff relationship will be examined now. FIG. 14A illustrates the way in which light beams entering the pixel 1001 propagate in a case where the amount of offset of the optical axis 1011 of the microlens 1010 is small as to the center 1026 of the barrier region 1025, with regard to the X-Z plane. The light beams repressed by solid lines, that enter the optical axis 1011 at an angle $+\theta_{(XZ)}$ (in the +X and −Z direction) are selectively guided to the photoelectric conversion portion 1022, as illustrated in FIG. 14A. In the same way, the light beams repressed by dotted lines, that enter the optical axis 1011 at an angle $-\theta_{(XZ)}$ (in the −X and −Z direction) are selectively guided to the first photoelectric conversion portion 1021. Accordingly, the light beams represented by the dotted light that have passed through the pupil region offset in the +X direction as to the optical axis of the photography lens are selectively detected at the first photoelectric conversion portion 1021, and the light beams represented by the solid light that have passed through the pupil region offset in the −X direction are selectively detected at the second photoelectric conversion portion 1022, so the baseline length is longer.

However, in the case of the pixel 1001 illustrated in FIG. 14A, the range of incident angle of the light beams received by the respective photoelectric conversion portions are equal to each other, and the amount of light entering the two photoelectric conversion portions is also approximately the same. Accordingly, the difference in sensitivity between the first photoelectric conversion portion 1021 and the second photoelectric conversion portion 1022 is small. The sensitivity ratio of the sensitivity of the first photoelectric conversion portion as to the sensitivity of the second photoelectric conversion portion is preferably twofold or larger, although this depends on the application.

Figure 14B:
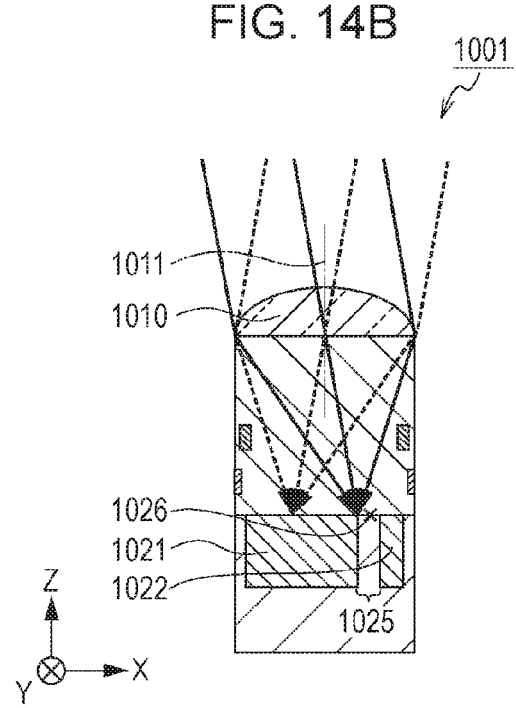

FIG. 14B illustrates the way in which light beams entering the pixel 1001 propagate in a case where the amount of offset of the optical axis 1011 of the microlens 1010 is large as to the center 1026 of the barrier region 1025, with regard to the X-Z plane. A great portion of light entering the pixel 1001 is guided to the first photoelectric conversion portion 1021, as illustrated in FIG. 14B. Accordingly, the sensitivity of the first photoelectric conversion portion 1021 is greater than the sensitivity of the second photoelectric conversion portion 1022, and the difference in sensitivity between the two is large. However, the light beams represented by dotted lines that have passed through the pupil region in the +X direction and a great part of the light beams represented by solid lines that have passed through the pupil region in the −X direction are guided to the first photoelectric conversion portion 1021, so the baseline length is relatively short.

Accordingly, the pixel 101 illustrated in FIGS. 2A through 2C have the direction in which the photoelectric conversion portions for acquiring ranging signals are disposed (X direction) and the photoelectric conversion region for acquiring signals with different sensitivities from each other (Y direction) are made to differ, and intersect each other. According to this configuration, a solid-state imaging device can be realized where signals for ranging with a long baseline length, and signals having difference sensitivities of which the difference in sensitivities is sufficient, can be acquired at the same time.

Figure 3A:
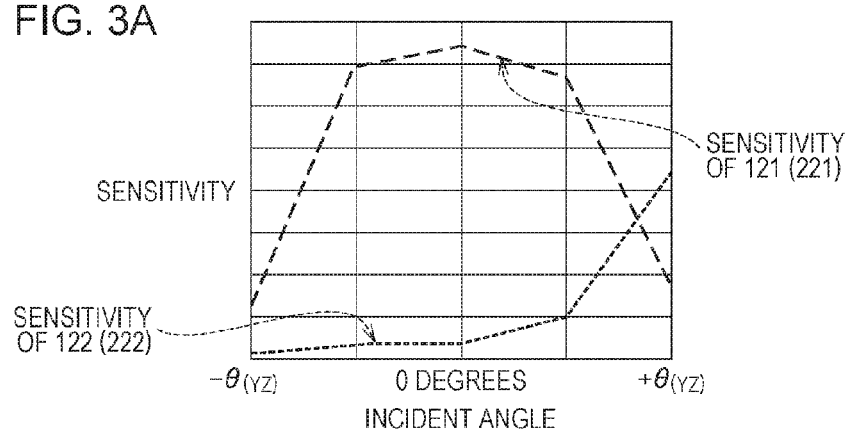
FIGS. 3A through 3C are diagrams illustrating angular dependency of the sensitivities of photoelectric conversion portions provided to the pixel according to the first embodiment.

FIG. 3A illustrates angular dependency of the first and second photoelectric conversion regions in the pixel 101 in FIGS. 2A through 2C. Illustrated in FIG. 3A are the respective sensitivities of the first photoelectric conversion region 121 and second photoelectric conversion region 122 as to light beams entering the Y-Z plane at an angle. The "sensitivity of the first photoelectric conversion region 121" is the sum of sensitivity of the first photoelectric conversion portion 123 and second photoelectric conversion portion 124. It can be seen from FIG. 3A that the sensitivity of first photoelectric conversion region 121 is larger than the sensitivity of second photoelectric conversion region 122 at almost all angles. Accordingly, when considering the entirety of light beams entering the pixel, the sensitivity of the first photoelectric conversion region 121 is larger than the sensitivity of second photoelectric conversion region 122.

Figure 3B:
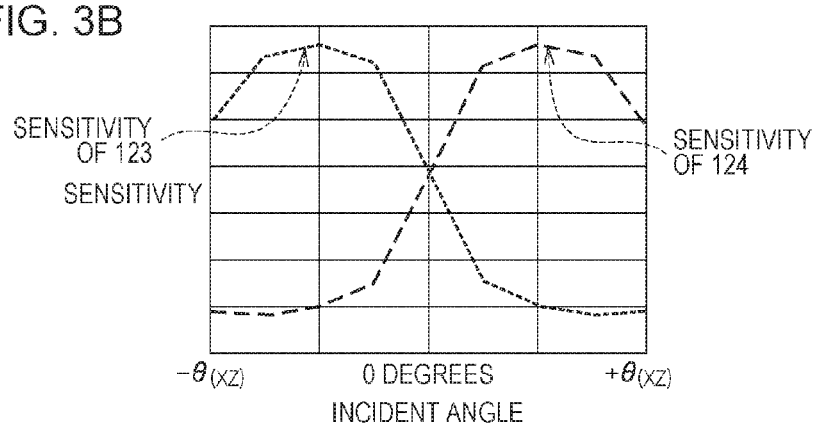

FIG. 3B illustrates the sensitivity of the first photoelectric conversion portion 123 and second photoelectric conversion portion 124 as to light beams entering the Y-Z plane at an angle. The horizontal axis of FIG. 3B shows an angle inclined toward +X and −Z as $+\theta_{(XZ)}$, and an angle inclined toward −X and −Z as $-\theta_{(XZ)}$, where the incident angle of a light beam entering in the −Z direction is zero. It can be seen from FIG. 3B that light beams entering at angle $+\theta_{(XZ)}$ are selectively guided to the second photoelectric conversion portion 124, and that light beams entering at angle $+\theta_{(XZ)}$ are selectively guided to the first photoelectric conversion portion 123.

Figure 3C:
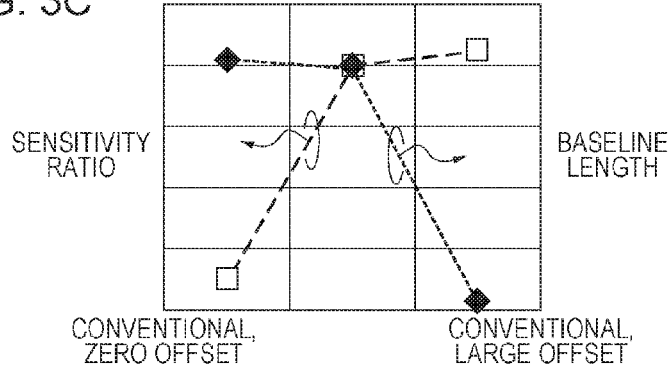

FIG. 3C illustrates the sensitivity ratio and baseline length of the pixel 101 of the solid-state imaging device 100 according to the present embodiment illustrated along with representative values of the pixel 1001 of the conventional solid-state imaging device 1000. The sensitivity ratio here means the sensitivity ratio between the first photoelectric conversion region 121 and second photoelectric conversion region 122 that acquire signals of different sensitivities in the pixel 101. The baseline length means the baseline length between the pupil region where the light beams that the first photoelectric conversion portion 123 receives and the baseline length between the pupil region where the light beams that the second photoelectric conversion portion 124 receives. Illustrated as representative values of the pixel 1001 of the conventional solid-state imaging device 1000 are a case where the optical axis of the microlens 1010 and center of barrier region match, as "conventional, zero offset", and a case where the optical axis of the microlens 1010 is markedly offset from the center of barrier region (value on right side in FIG. 13C), as "conventional, large offset". Note that in FIG. 13C, the case where the optical axis of the microlens is markedly offset from the center of barrier region (value on right side in FIG. 13C) is a case where the sensitivity ratio between the first photoelectric conversion portion and the second photoelectric conversion portion hardly changes even if the microlens is further offset.

It can thus be seen from the above-described drawings that the present invention can realize both a baseline length equivalent to the baseline length of the pixel 1001 in the conventional solid-state imaging device 1000 in a case where the amount of decentering is small, and a sensitivity equivalent to the sensitivity of the pixel 1001 in the conventional solid-state imaging device 1000 in a case where the amount of decentering is large.

An arrangement has been described so far where the optical axis 111 of the microlens 110 is offset in the first direction (Y direction) as to the center 126 of the first barrier region 125, but is not offset in the second direction (X direction) as to the center 128 of the second barrier region 127. However, the present invention is not restricted to these conditions. Specifically, it is sufficient for the amount of offset of the optical axis 111 in the first direction as to the center 126 of the first barrier region 125 to be larger than the amount of offset of the optical axis 111 in the second direction as to the center 128 of the second barrier region 127. Multiple signals for imaging that have difference sensitivities, and signals for ranging, and can be acquired at the same time by satisfying these conditions.

Note however, that an arrangement is more preferably where the optical axis 111 of the microlens 110 is offset in the first direction (Y direction) as to the center 126 of the first barrier region 125, but is not offset in the second direction (X direction) as to the center 128 of the second barrier region 127, as illustrated in FIGS. 2A through 2C. The reason is that the baseline length between the ranging image generated from electric signals acquired at the first photoelectric conversion portion 123 and ranging image generated from electric signals acquired at the second photoelectric conversion portion 124 can be maximized.

FIGS. 2A through 2C illustrate a case where the microlens 110 is decentered by offsetting the position of the symmetrical microlens 110 from the center 126 of the first barrier region 125 as to a plane (X-Z plane) that passes through the optical axis 111 of the microlens 110 and is perpendicular to the first direction (Y direction). However, the present invention is not restricted to this example.

Figure 4A:
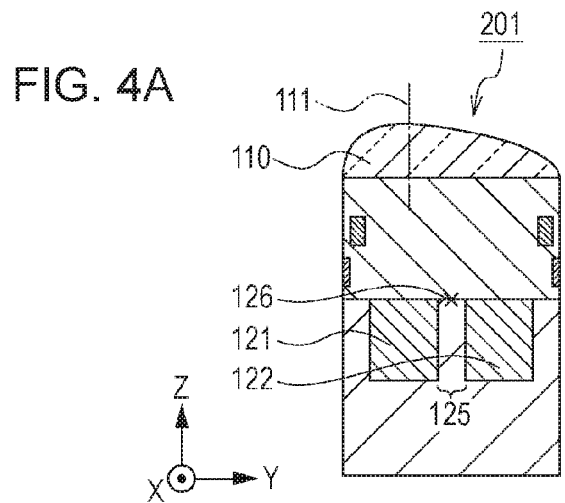
FIGS. 4A through 4C are diagrams illustrating modifications of a microlens disposed on the pixel according to the first embodiment.
Figure 4B:
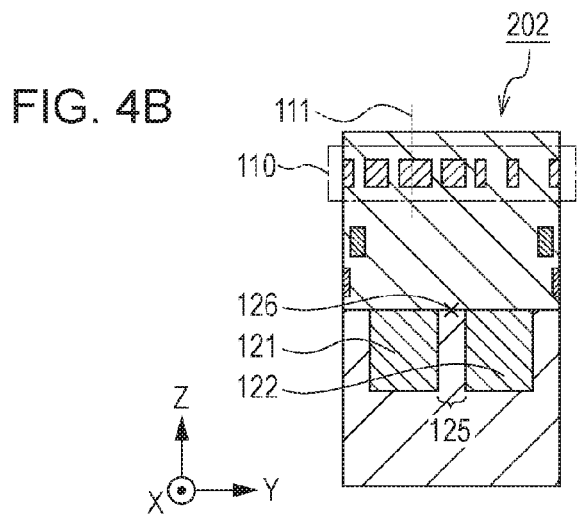
Figure 4C:
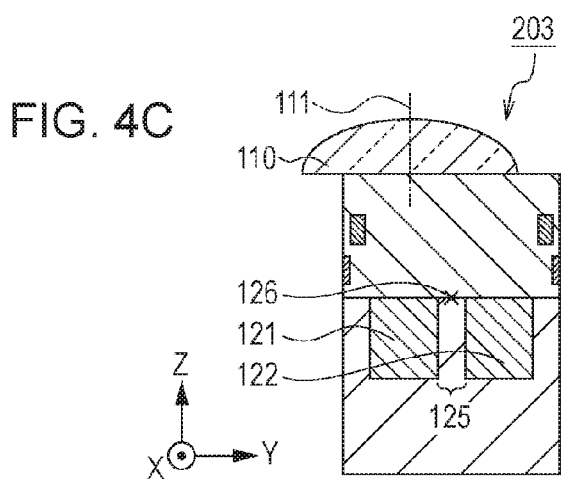

FIGS. 4A through 4C are diagrams illustrating various modifications, in the form of cross-sectional views corresponding to FIG. 2C. Although the first photoelectric conversion region 121 and the second photoelectric conversion region 122 are the same in each of FIGS. 4A through 4C, an arrangement may be made where they are different.

FIG. 4A illustrates a pixel 201 in which the optical axis 111 of the microlens 110 has been effectively offset from the center 126 of the first barrier region 125, by using a microlens that has a shape that is asymmetrical as to a plane perpendicular to the first direction (Y direction) and includes the optical axis of the microlens. FIG. 4B illustrates a pixel 202 in which the optical axis 111 of the microlens 110 has been effectively offset from the center 126 of the first barrier region 125, by using microlens that has a refractive index distribution that is asymmetrical as to a plane perpendicular to the first direction (Y direction) and includes the optical axis of the microlens. An asymmetrical refractive index distribution can be provided by forming layers making up the microlens of different materials, and providing an asymmetrical distribution of a filling ratio of a medium. Further, part of the microlens may protrude into an adjacent pixel, as with the case of the pixel 203 illustrated in FIG. 4C.

A configuration where a symmetrical microlens 110 is used, such as illustrated in FIGS. 2A through 2C and 4C, is preferable since manufacturing of the microlens is easy. On the other hand, a configuration where an asymmetrical lens shape or refractive index distribution is used, as illustrated in FIGS. 4A and 4B enables propagation of incident light to the pixel to be controlled more precisely by the lens shape and refractive index, and accordingly is preferable, since the sensitivity ratio of the first photoelectric conversion region 121 and second photoelectric conversion region 122 can be increased, and the baseline length of ranging images generated by signals can be made longer.

Figure 5A:
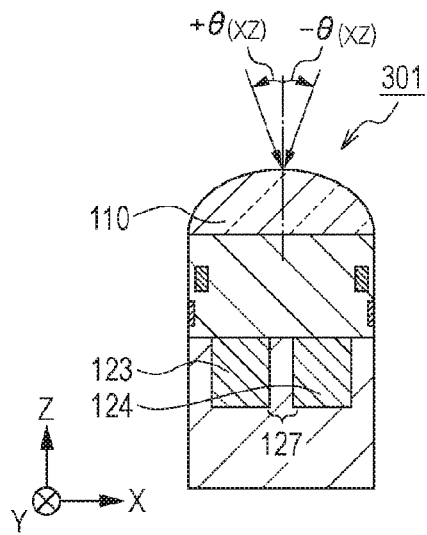
FIGS. 5A through 5C are diagrams illustrating an example of disposing a microlens having different refractive powers according to the direction according to the first embodiment, and a diagram illustrating angular dependency of sensitivity at a second photoelectric conversion region in this case.
Figure 5B:
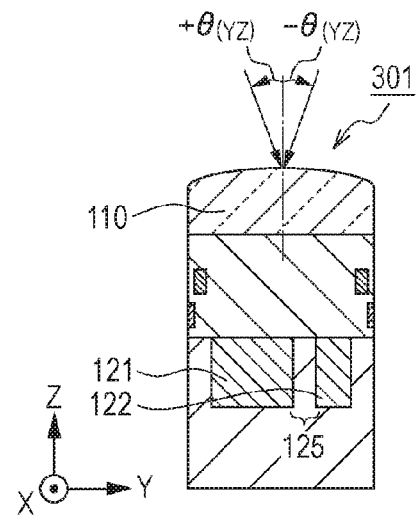
Figure 5C:
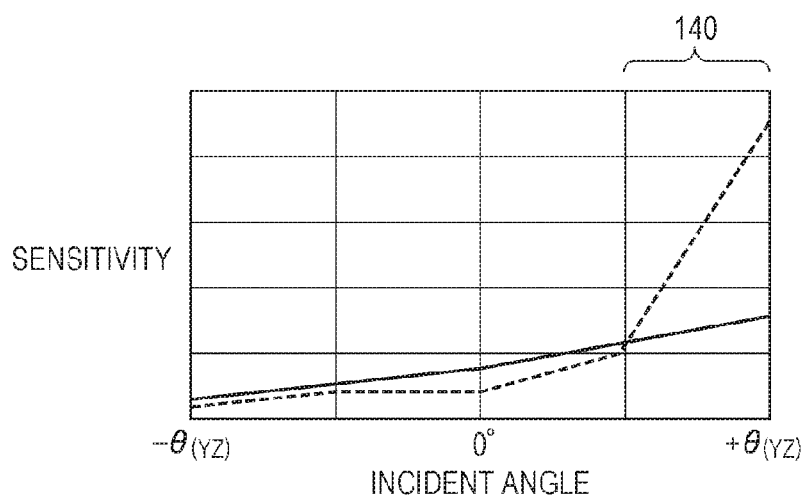

FIGS. 5A through 5C illustrate a pixel 301 using a microlens where the refractive power differs depending on the direction. Specifically, a lens is used in which the refractive power in the first direction (Y direction) where the photoelectric conversion region to acquire signals of different sensitivities is disposed, is smaller than the refractive power in the second direction (X direction) where the photoelectric conversion portions to receive light beams from different pupil regions are disposed. FIG. 5A is a cross-sectional view corresponding to FIG. 2B, and FIG. 5B is a cross-sectional view corresponding to FIG. 2C. the configuration illustrated in FIGS. 5A through 5C is preferable from the following reason.

The larger the refractive force of the microlens is, the greater the influence of the imaging relationship due to the microlens is, and the greater the angular dependence on the sensitivity ratio is. Accordingly, using a microlens that has a large refractive force in the second direction (X direction) where the photoelectric conversion portions for acquiring ranging signals are disposed enables the baseline length of the ranging signals acquired at the first photoelectric conversion portion 123 and the second photoelectric conversion portion 124 to be maximized, which is preferable.

On the other hand, the angular dependence of sensitivity is preferably smaller in the first direction (Y direction where the first photoelectric conversion region 121 and second photoelectric conversion region 122 for acquiring signals of different sensitivity are arrayed. The reason is that, if the angular dependence of sensitivity is large, distortion occurs in an out-of-focus image of the subject away from the focused position, since the first and second photoelectric conversion regions 121 and 122 receive only light beams from particular portions of the exit pupil region of the photographing lens being used. As a result, the image quality of the image generated by synthesizing the high-sensitivity signals and low-sensitivity signals will be lower. Accordingly, the refractive force of the microlens in the first direction (Y direction) where signals of different sensitivity are acquired is preferably reduced to reduce angular dependence of sensitivity.

FIG. 5C illustrates the dependency of the sensitivity of the second photoelectric conversion region 122 as to the incident angle of light beams entering the Y-Z plane, along with the incident angle dependency of the sensitivity of the second photoelectric conversion region 122 in the pixel 101 illustrated in FIGS. 2A through 2C. The solid line in FIG. 5C represents the pixel 301 illustrated in FIGS. 5A and 5B (applying a microlens which has a smaller refractive force in the first direction as compared to the second direction), and the dotted line represents the pixel 101 illustrated in FIGS. 2A through 2C (applying a microlens where the refractive force is the same in the first direction and the second direction). It can be seen that employing a microlens which has a smaller refractive force in the first direction as compared to the second direction enables angular dependency of the sensitivity of the second photoelectric conversion region 122 to be reduced as to angular range 140 in particular, i.e., as to light beams entering the pixel at a large angle $+\theta_{(XZ)}$.

Figure 6A:
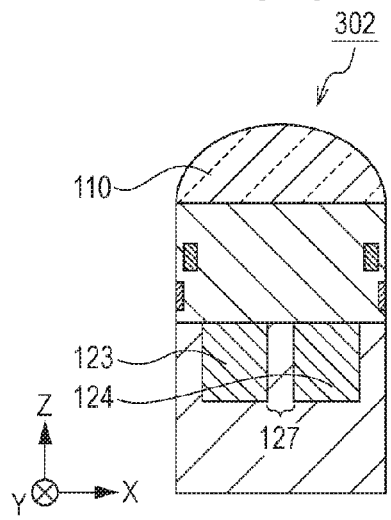
FIGS. 6A through 6D are diagrams illustrating specific examples of positioning the microlens having different refractive powers according to the direction on the pixel according to the first embodiment.
Figure 6B:
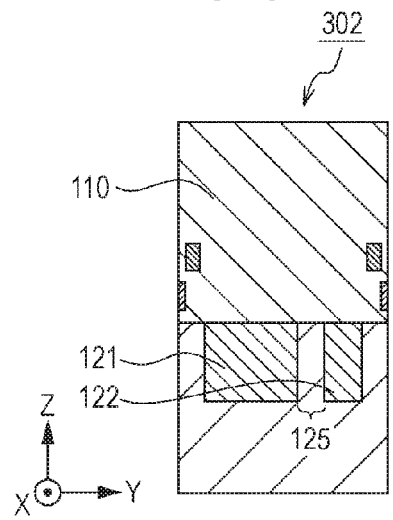

If the refractive force in the X direction is smaller than the refractive force in the Y direction, a cylinder lens where the refractive force in the Y direction is zero, i.e., where the axis is in the second direction, may be used as the microlens, as in the pixel 302 illustrated in FIGS. 6A and 6B. In a case where multiple microlenses are layered in the Z direction of the pixel, the refractive force may be changed between the X direction and Y direction of one microlens, or the refractive force may be changed between the X direction and Y direction of both microlenses.

Figure 6C:
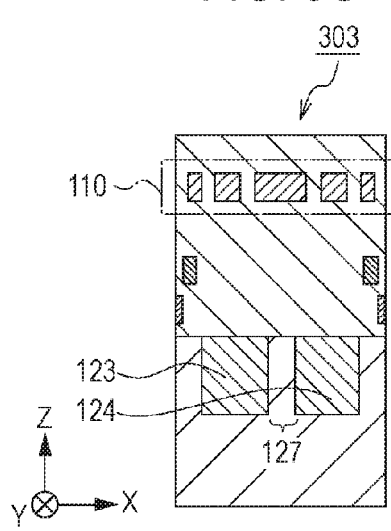
Figure 6D:
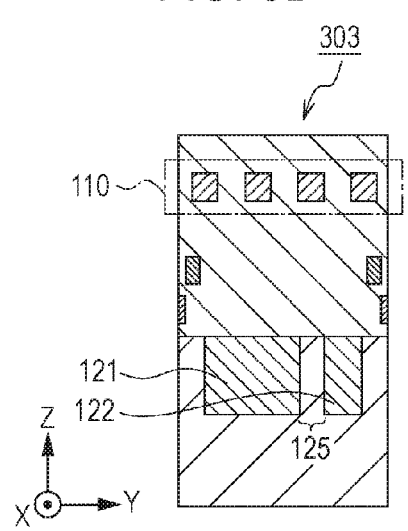

Alternatively, a digital lens where the refractive force is changed by changing the refractive index according to the direction may be used as the microlens, as in a pixel 303 illustrated in FIGS. 6C and 6D. The refractive force in the X direction and Y direction can be independently controlled by forming layers making up the digital lens of different materials, and providing a difference in the filling ratio of the medium between the X direction and Y direction.

Figure 7A:
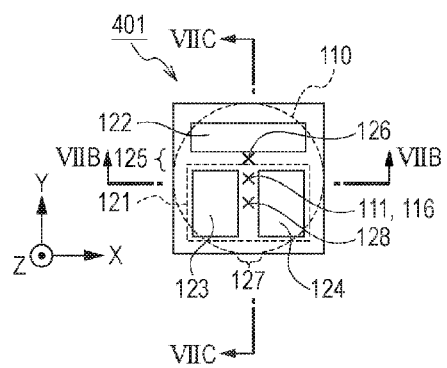
FIGS. 7A through 7D are diagrams illustrating a configuration example in a case of providing an optical waveguide to the pixel according to the first embodiment, and a diagram illustrating angular dependency of sensitivity at the second photoelectric conversion region in this case.
Figure 7B:
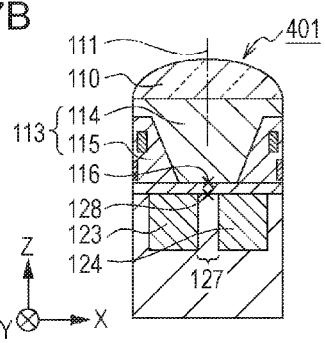
Figure 7C:
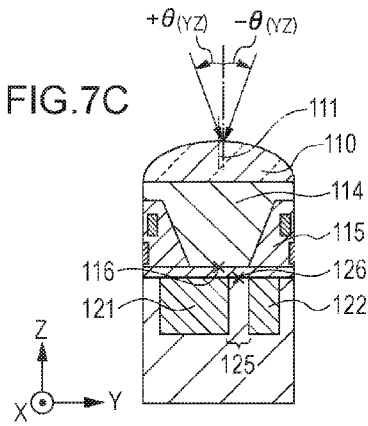

An optical waveguide 113 may be provided between the microlens 110 and the second photoelectric conversion region 122 and photoelectric conversion portions 123 and 124, as in a pixel 401 illustrated in FIGS. 7A and 7B. FIG. 7A is a diagram illustrating the light incidence face (X-Y plane) of the pixel 101, FIG. 7B is a cross-sectional view (X-Z cross-section) taken along line VIIB-VIIB in FIG. 7A, and FIG. 7C is a cross-sectional view (Y-Z cross-section) taken along line VIIC-VIIC in FIG. 7A.

Figure 7D:
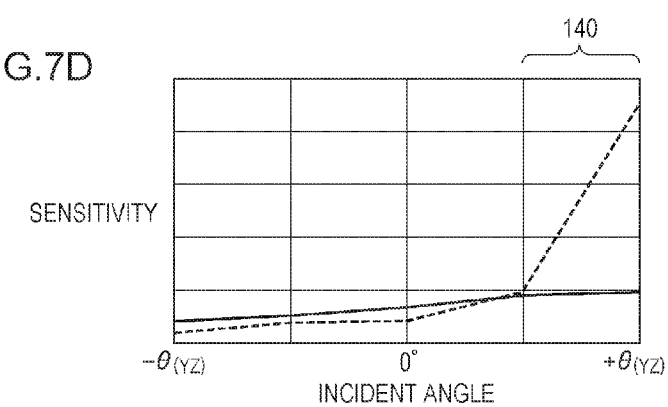

Providing the optical waveguide 113 is preferable, since it reduces the angular dependency of the second photoelectric conversion region 122 as to light beams entering the Y-Z plane at an angle. FIG. 7D illustrates the angular dependency of the second photoelectric conversion region 122 in a case where the optical waveguide 113 has been provided, along with a case where no optical waveguide is provided. It can be seen from FIG. 7D that providing the optical waveguide 113 enables angular dependency of the sensitivity of the second photoelectric conversion region 122 to be reduced as to angular range 140 in particular, i.e., as to light beams entering the pixel at a large angle $+\theta_{(XZ)}$.

The optical waveguide 113 is made up of a core 114 and cladding 115. Examples of the material thereof include silicon oxide, silicon nitride, silicon oxynitride, silicon carbide, BPSG, and like inorganic materials, and polymers, resins, and like organic materials. The combination of material is selected, however, so that the refractive index of the core 114 is larger than the refractive index of the cladding 115.

Note that the center 116 at the exit end of the core 114 of the optical waveguide 113 preferably is offset as to the center 126 of the first barrier region 125 in the same direction as the optical axis 111 of the microlens 110. This configuration enables the difference in sensitivity between the first photoelectric conversion region 121 and second photoelectric conversion region 122 to be increased. Further, the center 116 at the exit end of the core 114 preferably is not decentered in the second direction (X direction) as to the center 128 of the second barrier region 127. According to this configuration, the light from the pupil regions can be selectively guided to each of the first photoelectric conversion portion 123 and the second photoelectric conversion portion 124, and thus the baseline length can be increased.

Accordingly, in a case of providing the pixel with the optical waveguide 113, the amount of offset in the first direction of the center 116 of the core 114 as to the center 126 of the first barrier region 125 is preferably larger than the amount of offset in the second direction of the center 116 as to the center 128 of the second barrier region 127. Although part of the core 114 of the optical waveguide 113 may protrude to the adjacent pixel, in the same way as the microlens 110, care is taken that the exit end of the core 114 does not protrude to the adjacent pixel. A microlens having different refractive forces in the X direction and the Y direction may be used along with the optical waveguide 113 as well.

Description has been made so far regarding a so-called front-side illumination solid-state imaging device, where lines 112 are formed on the same side of the substrate 120 as the microlens 110. However, the present invention may be applied to a so-called back-side illumination solid-state imaging device where the lines 112 are provided on the opposite side of the substrate 120 from the microlens 110. Particularly, in a case where an optical waveguide 113 is provided to the pixel such as in the configuration illustrated in FIGS. 7A through 7C, a back-side illumination arrangement is preferably, since the wiring layout would be restricted by the optical waveguide 113 in a front-side illumination solid-state arrangement.

The first direction in which the first photoelectric conversion region 121 and the second photoelectric conversion region 122 are arrayed in the pixel does not have to be aligned with the Y direction in FIGS. 2A through 2C, and may be the X direction or a diagonal direction. In the same way, the second direction in which the first photoelectric conversion portion 123 and the second photoelectric conversion portion 124 are arrayed in the pixel does not have to be aligned with the X direction, and may be a diagonal direction, as long as the second direction intersects the first direction. However, the closer the angle between the first direction and the second direction is to 90 degrees the more preferable, since the direction of acquiring light beams from the pupil region and the direction of acquiring signals of a different sensitivity can be separated. A case where the angle between the first direction and the second direction is 90 degrees (perpendicular) is particularly preferable, since the direction of acquiring light beams from the pupil region and the direction of acquiring signals of a different sensitivity are independent. Note that the case where the angle between the first direction and the second direction is 90 degrees (perpendicular) tolerates variation in the order of the margin of manufacturing error. Specifically, the "case where the angle between the first direction and the second direction is 90 degrees" here includes a range of ±10 degrees as to 90 degrees.

The second direction matches the direction in which pixels are arrayed. This is preferable, since the sampling of ranging images generated from signals is finer, and the detection precision of the amount of image offset improves. Accordingly, an arrangement such as illustrated in FIGS. 2A through 2C where the first direction is the Y direction and the second direction is the X direction, or the first direction is the X direction and the second direction is the Y direction, is preferable.

The potential distribution of the first barrier region 125 and the potential distribution of the center 126 may be formed separately. In a case where there is crosstalk of charges ("crosstalk of charges" may be referred to simply as "crosstalk" hereinafter) between the first photoelectric conversion portion 123 and second photoelectric conversion portion 124, signals generated at the respective photoelectric conversion portions cannot be acquired in a separated manner. Accordingly, in a case where there is high priority on ranging precision, the magnitude of electric separation of the first barrier region 125 is preferably larger than the magnitude of electric separation of the second barrier region 127.

On the other hand, in a case of acquiring signals of a different sensitivity, the sum of signals generated at the first photoelectric conversion portion 123 and signals generated at the second photoelectric conversion portion 124 is used as high-sensitivity signals, so the magnitude of high-sensitivity signals does not change even if there is crosstalk of charges. On the other hand, in a case where there is crosstalk of charges between the first photoelectric conversion region 121 and the second photoelectric conversion region 122, charges from the first photoelectric conversion region 121 where sensitivity is high are diffused to the second photoelectric conversion region 122 where sensitivity is low. This particularly changes the magnitude of the low-sensitivity signals. Accordingly, in a case where there is high priority on images of different sensitivities, the magnitude of electric separation of the first barrier region 125 is preferably larger than the magnitude of electric separation of the second barrier region 127.

Figure 8A:
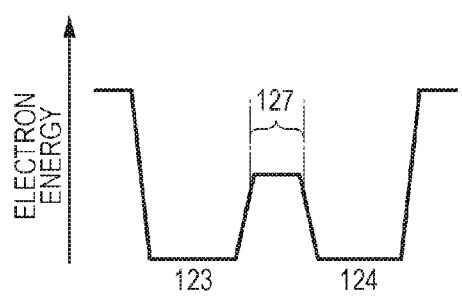
FIGS. 8A through 8D are diagrams illustrating an example of potential distribution at first and second barrier regions provided in the pixel according to the first embodiment.
Figure 8B:
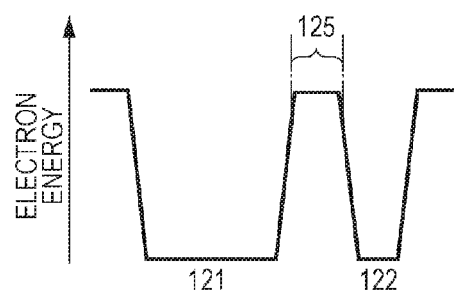
Figure 8C:
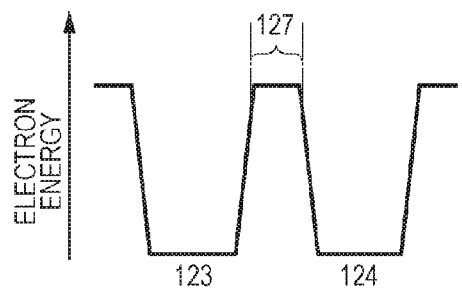
Figure 8D:
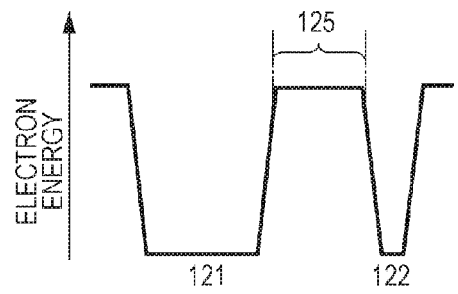

Particularly, the greater the difference in sensitivity between the photoelectric conversion portion is, the greater the effect of crosstalk between the photoelectric conversion portions is, so the magnitude of electric separation of the first barrier region 125 is preferably larger than the magnitude of electric separation of the second barrier region 127. Increasing the magnitude of electric separation can be achieved by raising the height of the potential barrier in the barrier region. Specifically, this can be done by making the height of the potential barrier of the first barrier region 125 higher than the height of the potential barrier of the second barrier region 127, as illustrated in FIGS. 8A and 8B. The height of the potential barrier is represented by φ with the base of electronic energy of the first photoelectric conversion region 121 and second photoelectric conversion region 122 as the origin. Since electrons accumulated in a photoelectric conversion portion classically follow a Boltzmann distribution, the charge density n crossing the potential barrier satisfies the following Expression (1)

$$n \propto \exp\left[-\frac{e\phi}{kT}\right] \quad (1)$$

where e represents the elementary charge, k represents the Boltzmann constant, and T represents the temperature of the photoelectric conversion portion.

It can be said that the magnitude of electric separation of the first barrier region 125 is sufficiently larger than the electric separation of the second barrier region 127 if the crosstalk of charges between the first photoelectric conversion region 121 and second photoelectric conversion region 122 is 1/10 or smaller than the crosstalk of charges between the first photoelectric conversion portion 123 and second photoelectric conversion portion 124. Accordingly, the following Expression (2) is preferably satisfied $$\phi_1 - \phi_2 \geq \frac{\ln[10]}{e}kT \quad (2)$$

where $\phi_1$ represents the height of the first barrier region 125 and $\phi_2$ represents the height of the second barrier region 127.

It is sufficient for the difference between $\phi_1$ and $\phi_2$ to be 74 mV in a case where the temperature of the photoelectric conversion portion is around 100° C. Expression is derived through the following process (Expression (3))

$$n_1 \propto \exp\left[-\frac{e\phi_1}{kT}\right] \quad (3)$$

$$n_2 \propto \exp\left[-\frac{e\phi_2}{kT}\right]$$

$$\Rightarrow \frac{n_2}{n_1} = \exp\left[\frac{e\phi_1}{kT} - \frac{e\phi_2}{kT}\right]$$

$$\Rightarrow \ln\left[\frac{n_2}{n_1}\right] = \left[\frac{e\phi_1}{kT} - \frac{e\phi_2}{kT}\right]$$

$$\Rightarrow \ln[10] \leq \ln\left[\frac{n_2}{n_1}\right] = \left[\frac{e\phi_1}{kT} - \frac{e\phi_2}{kT}\right]$$

$$\Rightarrow \frac{\ln[10]}{e}kT \leq \phi_1 - \phi_2$$

where $n_1$ and $n_2$ respectively represent charge densities crossing the potential barriers of the first barrier region 125 and the second barrier region 127.

Figure 15A:
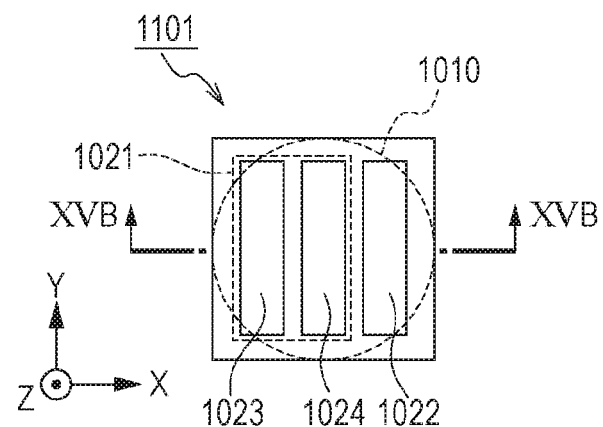
FIGS. 15A and 15B are diagrams illustrating a pixel where multiple photoelectric conversion portions for acquiring ranging signals, and multiple photoelectric conversion regions for acquiring imaging signals with different sensitivities from each other, are arrayed in the same direction.

Note that intersecting the direction in which the first photoelectric conversion region 121 and second photoelectric conversion region 122 are arrayed with the direction in which the first photoelectric conversion portion 123 and second photoelectric conversion portion 124 are arrayed is advantageous from the perspective of crosstalk among the photoelectric conversion portions. Description will be made by comparison with a case of a pixel 1101 illustrated in FIGS. 15A and 15B, in which the first photoelectric conversion region 1021, second photoelectric conversion region 1022, first photoelectric conversion portion 1023, and second photoelectric conversion portion 1024, are all arrayed in the same direction. FIG. 15A is a view from the light entry side of the photoelectric conversion portions (X-Y view), and FIG. 15B is a cross-sectional view taken along line XVB-XVB in FIG. 15A, as viewed from the Y side (X-Z cross-sectional view).

Figure 15B:
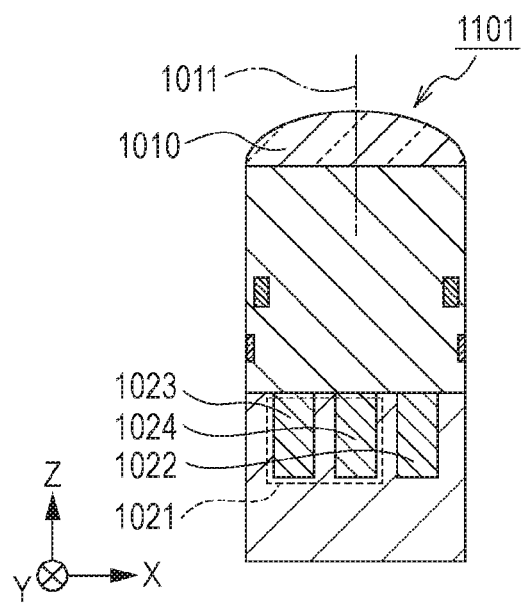

In the case illustrated in FIGS. 15A and 15B, the crosstalk between the adjacent second photoelectric conversion portion 1024 and second photoelectric conversion region 1022 is greater than the crosstalk between the first photoelectric conversion portion 1023 and second photoelectric conversion region 1022 that are not adjacent. Accordingly, there is difference in sensitivity between the first photoelectric conversion portion 1023 unaffected by crosstalk and the second photoelectric conversion portion 1024 affected by crosstalk, which leads to poorer ranging precision.

In the present invention, the direction in which the first photoelectric conversion region 121 and second photoelectric conversion region 122 are arrayed is made to intersect with the direction in which the first photoelectric conversion portion 123 and second photoelectric conversion portion 124 are arrayed. Accordingly, the second photoelectric conversion portion 124 next to the first photoelectric conversion portion 123 is also adjacent to the second photoelectric conversion region 122, and is affected by crosstalk along with the second photoelectric conversion region 122. Thus, the influence of the crosstalk between the first photoelectric conversion portion 123 and second photoelectric conversion region 122, and the influence of the crosstalk between the second photoelectric conversion portion 124 and second photoelectric conversion region 122 can be reduced. As a result, the difference in sensitivity between the first photoelectric conversion portion 123 and the second photoelectric conversion portion 124 is reduced, and ranging precision improves.

Further, an arrangement where the direction of arraying multiple photoelectric conversion portions to acquire signals of different sensitivities and the direction of arraying multiple photoelectric conversion portions to acquire ranging signals are made to intersect as in the present invention is also advantageous in that charge transfer from the photoelectric conversion portions is faster.

Comparison will be made with a case such as the pixel 1101 illustrated in FIGS. 15A and 15B, where the first photoelectric conversion portion 1023 and second photoelectric conversion portion 1024 for acquiring ranging signals and the first photoelectric conversion region 1021 and second photoelectric conversion region 1022 for acquiring signals of different sensitivities are arrayed in the same direction. Generally, transfer electrodes for transferring charges generated at the photoelectric conversion portions to the peripheral circuits 104 are formed at the end portions of the photoelectric conversion portions. In order to acquire the charges from the second photoelectric conversion portion 1024 of which both long sides are adjacent to the other photoelectric conversion portions, transfer electrodes are formed on the short sides. This means that the cross-sectional area of the channels of the transfer electrodes is small, thereby reducing the transfer speed of charges.

Conversely, the pixel 101 of the solid-state imaging device 100 according to the present invention is configured such that the direction in which the first photoelectric conversion region 121 and second photoelectric conversion region 122 are arrayed, and the direction in which the first photoelectric conversion portion 123 and second photoelectric conversion portion 124 are arrayed, intersect. Accordingly, none of the photoelectric conversion portions are sandwiched between other photoelectric conversion portions, and accordingly the transfer electrodes can be formed following any of three sides. That is to say, transfer electrodes can be formed following the side out of the three sides where the cross-sectional are of the transfer channels can be formed widest, thereby improving charge transfer speed.

Figure 9A:
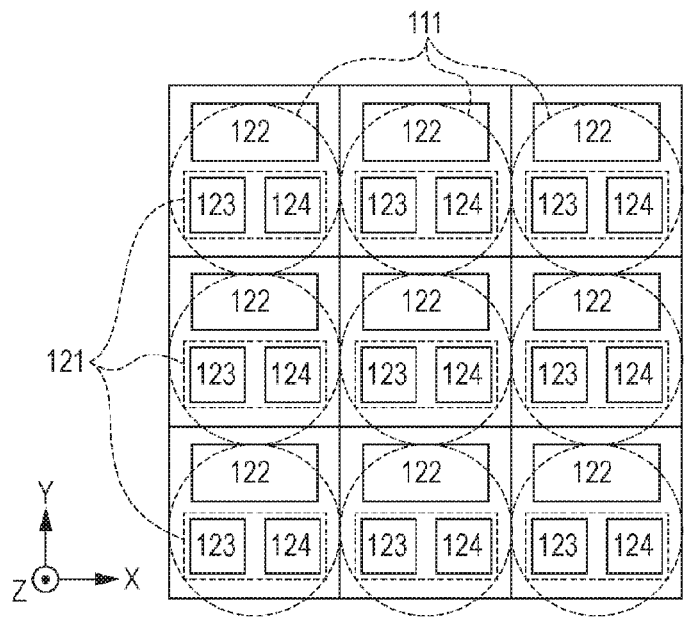
FIGS. 9A and 9B are diagrams illustrating layout examples of pixels in the solid-state imaging device according to the first embodiment.
Figure 9B:
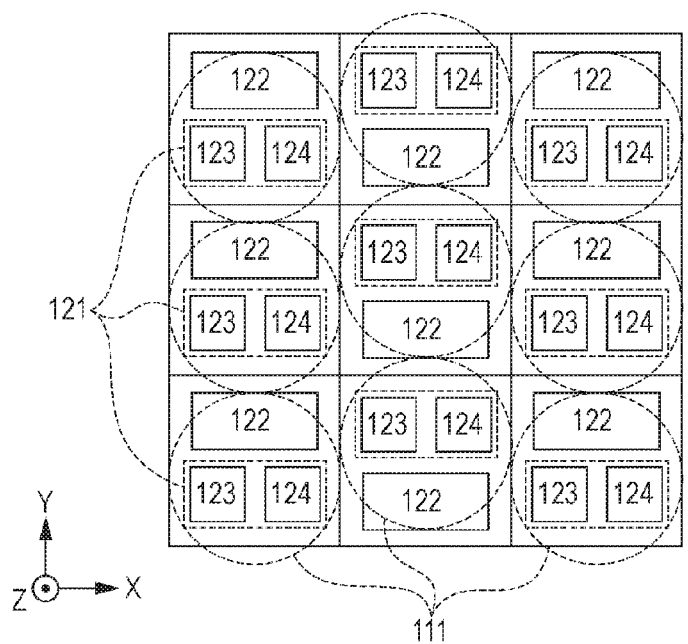

While description has been made in detail with regard to the configuration of one pixel, the layout of the photoelectric conversion portions, barrier regions, and microlenses may differ among multiple pixels, or may be the same. In a case where part of the microlens 110 protrudes to the adjacent pixel as illustrated in FIG. 4C, a layout such as illustrated in FIG. 9A or 9B enables the layout to be made without microlenses 110 interfering among adjacent pixels, which is preferable. Note that FIGS. 9A and 9B illustrate the configuration of multiple pixels laid out in the center region 102 illustrated in FIG. 1.

In FIG. 9A, the direction from the first photoelectric conversion region 121 toward the second photoelectric conversion region 122 is the same +X direction in all of the multiple pixels. In FIG. 9B, the direction from the first photoelectric conversion region 121 toward the second photoelectric conversion region 122 is reversed among adjacent pixels in the X direction.

Moreover, the direction from the first photoelectric conversion region 121 toward the second photoelectric conversion region 122 may differ from one pixel to another, in the X direction, Y direction, and diagonal directions. Note that the term "the direction from the first photoelectric conversion region 121 toward the second photoelectric conversion region 122" means the direction from the center of gravity of the first photoelectric conversion region toward the center of gravity of the second photoelectric conversion region.

Second Embodiment

Figure 10A:
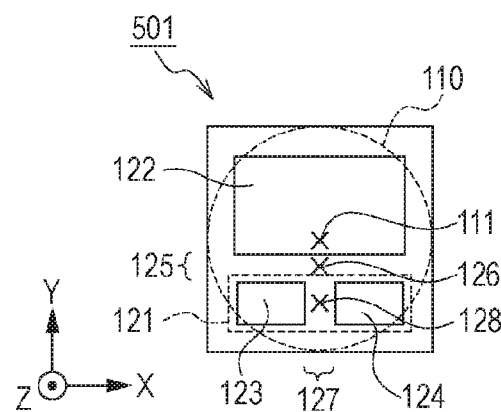
FIGS. 10A through 10C are diagrams illustrating layout examples of pixels in a solid-state imaging device according to a second embodiment.
Figure 10B:
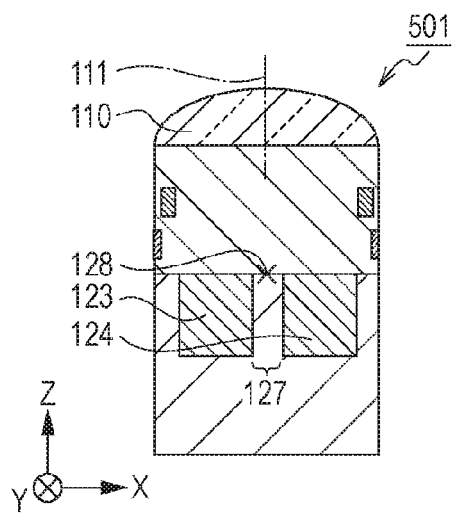
Figure 10C:
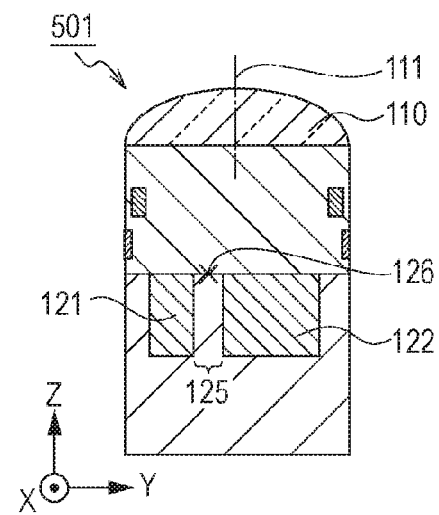

FIGS. 10A through 10C are diagrams illustrating other configuration examples of pixels disposed in the center region of a solid-state imaging device according to a second embodiment. A pixel 501 differs from the pixel 101 in FIGS. 2A through 2C in that the direction in which the optical axis 111 of the microlens 110 has been offset is in the opposite direction. That is to say, the optical axis 111 of the microlens 110 is disposed offset as to the center 126 of the first barrier region 125 that electrically separates the first photoelectric conversion region 121 and second photoelectric conversion region 122, in the direction of the second photoelectric conversion region 122 (+Y direction), as can be seen from FIGS. 10A and 10C.

Accordingly, the sensitivity of the second photoelectric conversion region 122 is larger than the sensitivity of the first photoelectric conversion region 121 in the pixel 501. Accordingly, in the case of the present embodiment, the signals acquired at the first photoelectric conversion region 121 are used as low-sensitivity signals, and the signals acquired at the second photoelectric conversion region 122 are used as high-sensitivity signals.

As can be seen from the first embodiment and the present embodiment, it is sufficient in the present invention for high-sensitivity signals to be acquired by one of the first photoelectric conversion region 121 and second photoelectric conversion region 122, and low-sensitivity signals acquired by the other. Which photoelectric conversion region to use to acquire high-sensitivity signals or low-sensitivity signals is determined by the direction in which the optical axis 111 of the microlens 110 is offset.

The optical axis 111 of the microlens 110 is not offset in the X direction of the center 128 of the second barrier region 127 that electrically separates the first photoelectric conversion portion 123 and second photoelectric conversion portion 124 (see FIG. 10B). Accordingly, the first photoelectric conversion portion 123 and second photoelectric conversion portion 124 can receive light beams that have passed through pupil regions offset in opposite directions from each other (−X direction and +X direction) as to the optical axis of the photographing lens for the first photoelectric conversion portion 123 and second photoelectric conversion portion 124.

As described above, in the solid-state imaging device 100 according to the second embodiment as well, ranging signals that have passed through different pupil ranges from each other are acquired by the first photoelectric conversion portion 123 and second photoelectric conversion portion 124 arrayed in the second direction (X direction). Of the first photoelectric conversion region 121 and second photoelectric conversion region 122 arrayed in the first direction (Y direction) that intersects the second direction, low-sensitivity signals are acquired from the first photoelectric conversion region 121, and high-sensitivity signals are acquired from the second photoelectric conversion region 122. The sum of signals acquired by the first photoelectric conversion portion 123 and second photoelectric conversion portion 124 is equivalent to low-sensitivity signals acquired by the first photoelectric conversion region 121. Various modifications can be applied to the solid-state imaging device 100 according to the second embodiment in the same way as with the first embodiment.

Third Embodiment

Figure 11:
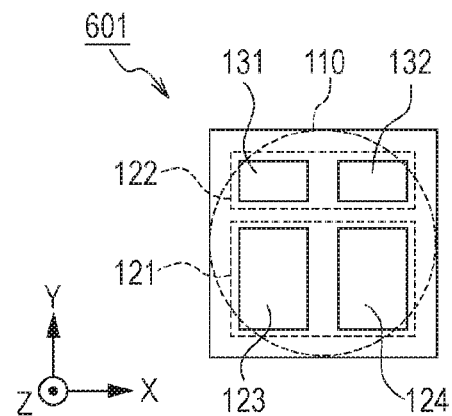
FIG. 11 is a diagram illustrating a layout example of a pixel in a solid-state imaging device according to a third embodiment.

FIG. 11 is a diagram illustrating a configuration example of another pixel according to a third embodiment of the present invention, provided in the center region of the solid-state imaging device. A pixel 601 differs from the pixel 101 illustrated in FIGS. 2A through 2C in that a third photoelectric conversion portion 131 and a fourth photoelectric conversion portion 132 are disposed in the second photoelectric conversion region 122 arrayed in the second direction (X direction).

This configuration enables light beams that have passed through pupil regions offset in opposite directions (−X direction and +X direction) as to the optical axis of the photographing lens to be received at the third photoelectric conversion portion 131 and fourth photoelectric conversion portion 132. Accordingly, ranging may be performed using signals acquired at the first photoelectric conversion portion 123 and second photoelectric conversion portion 124, or ranging may be performed using signals acquired at the third photoelectric conversion portion 131 and fourth photoelectric conversion portion 132. Also, the results from both may be compared to determine the reliability of the results of ranging.

Fourth Embodiment

An arrangement will be described in a fourth embodiment where multiple signals having different sensitivities from each other, acquired at a solid-state imaging device, are used to widen the dynamic range. The multiple photoelectric conversion portions having different sensitivities from each other are driven for the same exposure time, high-sensitivity signals and low-sensitivity signals are acquired from each, and these are synthesized to generate an image with a wide dynamic range in the present embodiment.

The second photoelectric conversion region 122 and photoelectric conversion portions 123 and 124 are driven so that the exposure time of each is the same, by signals transmitted from the peripheral circuits 104 of the solid-state imaging device 100 via the lines 112. That is to say, the exposure time of the first photoelectric conversion portion 123 and the exposure time of the second photoelectric conversion portion 124 are the same, and the exposure time of the first photoelectric conversion region 121 and the exposure time of the second photoelectric conversion region 122 are the same.

An image having a wide dynamic range can be generated by using high-sensitivity signals acquired at the first photoelectric conversion region 121 in a case where the amount of light entering the pixel is equal to or lower than a certain threshold value, using low-sensitivity signals acquired at the second photoelectric conversion region 122 in a case where the amount of light entering the pixel exceeds the threshold value, and synthesizing the two. The threshold value is set to a value smaller than a signal intensity where the high-sensitivity signals saturate, and a value larger than a signal intensity where the low-sensitivity signals reach a desired signal-to-noise ratio.

The following Expression (4) needs to be satisfied in order to widen the dynamic range by synthesizing high-sensitivity signals and low-sensitivity signals. S1 represents the sensitivity of the first photoelectric conversion region 121 that acquires high-sensitivity signals, and C1 represents the capacitance thereof. S2 represents the sensitivity of the second photoelectric conversion region 122 that acquires low-sensitivity signals, and C2 represents the capacitance thereof. The sensitivity of the first photoelectric conversion region 121 is the sum of the sensitivities of the first photoelectric conversion portion 123 and second photoelectric conversion portion 124, as mentioned earlier. In the same way, the capacitance of the first photoelectric conversion region 121 is the sum of the capacitances of the first photoelectric conversion portion 123 and second photoelectric conversion portion 124.

$$C1/S1 > C2/S2 \quad (4)$$

C1/S1 and C2/S2 each are the maximum amount of light which can enter each photoelectric conversion region, so in a case where C1/S1≤C2/S2, the second photoelectric conversion region 122 that acquires low-sensitivity signals will saturate at an amount of light equal to or smaller than the amount of light at which the first photoelectric conversion region 121 that acquires high-sensitivity signals saturates. Accordingly, the values of C1, C2, S1, and S2 have to be controlled beforehand to satisfy Expression (4).

The ratio between S1 and S2 (sensitivity ratio between photoelectric conversion regions) can be controlled by changing the amount of offset to the microlens 110 in the first direction, and changing the size of the photoelectric conversion regions and barrier regions.

The capacitance of the photoelectric conversion regions can be raised by increasing the cubic content of the photoelectric conversion portions or raising the doping concentration of the photoelectric conversion portions. The cubic content of the photoelectric conversion portions can be increased by having a wider aperture area for the photoelectric conversion portions, or implanting ions deeper so that the photoelectric conversion portions are formed deeper. Note however, that an arrangement where the depth and doping concentration of the second photoelectric conversion region 122 (third photoelectric conversion portion 131 and fourth photoelectric conversion portion 132), the first photoelectric conversion portion 123, and the second photoelectric conversion portion 124 are the same is preferable, since the photoelectric conversion portions can be formed under the same ion implantation conditions, thus facilitating the manufacturing process.

Fifth Embodiment

An arrangement where multiple signals having different sensitivities from each other that have been acquired by a solid-state imaging device are used to acquire moving images and still images will be described in a fifth embodiment. In the case of the present embodiment, multiple photoelectric conversion portions having different sensitivities from each other are driven at different exposure times from each other, thereby acquiring an image with low sensitivity and a long exposure time, and an image with high sensitivity and a short exposure time, at the same time.

Generally, it is often the case that exposure time necessary to acquire a smooth moving image is longer than exposure time necessary to acquire a still image. Accordingly, description will be made below regarding a case of using signals acquired at a photoelectric conversion portion with low sensitivity and a long exposure time are used for moving images, and using signals acquired at a photoelectric conversion portion with high sensitivity and a short exposure time are used for still images. In a case where the exposure time of a still image is longer than the exposure time of a moving image, signals acquired at the photoelectric conversion portion with low sensitivity and a long exposure time can be used for the still, and using signals acquired at the photoelectric conversion portion with high sensitivity and a short exposure time can be used for the moving image.

Although any of the solid-state imaging devices described in the first through third embodiments can be used in the present embodiment, description will be made regarding the case of the solid-state imaging device illustrated in FIGS. 2A through 2C. In a case where the direction of offset of the optical axis of the microlens is the opposite to that in FIGS. 2A through 2C, such as the solid-state imaging device described in the second embodiment, the signals acquired at the first photoelectric conversion region can be used for moving images, and the signals acquired at the second photoelectric conversion region can be used for still images.

The first photoelectric conversion portion 123 and second photoelectric conversion portion 124 in the present embodiment are driven such that the exposure time of each is equal to the other, and shorter than the exposure time of the second photoelectric conversion region 122. That is to say, the exposure time of the first photoelectric conversion region 121 is shorter than the exposure time of the second photoelectric conversion region 122. The a still image is generated from the sum of signals acquired from the first photoelectric conversion portion 123 and signals acquired from the second photoelectric conversion portion 124, i.e., signals acquired from the first photoelectric conversion region 121 are used to generate a still image, and signals acquired from the second photoelectric conversion region 122 are used to generate a moving image. At the same time, ranging signals are acquired by the first photoelectric conversion portion 123 and second photoelectric conversion portion 124 arrayed in the second direction (X direction) receiving light beams that have passed through pupil regions offset in opposite directions (−X direction and +X direction) as to the optical axis of the photographing lens.

Next, a modification unique to the solid-state imaging device 100 according to the present embodiment will be described. Specifically, this relates to the sensitivity and capacitance of the first photoelectric conversion region 121 and second photoelectric conversion region 122.

One image having a wide dynamic range was generated in the fourth embodiment by synthesizing the signals acquired at the first photoelectric conversion region 121 and the second photoelectric conversion region 122. Accordingly, there was the need for the first photoelectric conversion region 121 and second photoelectric conversion region 122 to satisfy Expression (4). However, the solid-state imaging device 100 according to the present embodiment generates separate images using the signals acquired at the first photoelectric conversion region 121 and the second photoelectric conversion region 122. Accordingly, the signal intensities and dynamic ranges of the signals for the still image and the signals for the moving images are preferably as close as possible.

Specifically, it is most preferable that the following Expressions (5) and (6) are satisfied. In Expressions (5) and (6), S1 represents the sensitivity of the first photoelectric conversion region 121 that acquires signals for still images, C1 represents the capacitance thereof, and T1 represents the exposure time thereof. S2 represents the sensitivity of the second photoelectric conversion region 122 that acquires signals for moving images, C2 represents the capacitance thereof, and T2 represents the exposure time thereof. Expression (5) sets forth conditions regarding signal intensity, and Expression (6) sets forth conditions regarding dynamic range.

$$S1 \times T1 = S2 \times T2 \quad (5)$$

$$C1/(S1 \times T1) = C2/(S2 \times T2) \quad (6)$$

The ratio of S1 and S2 can be controlled by changing the decentering amount of the optical waveguide or changing the size of the photoelectric conversion portions or barrier regions. It can be seen from Expression (5) that the ratio of S1 and S2 can be decided assuming the exposure times to be used for the still image and moving image, in the solid-state imaging device according to the present embodiment. For example, in a case of assuming the exposure time of the moving image to be 1/60 seconds and the assuming the exposure time of the still image to be 1/600 seconds, the configuration of the pixel is decided such that S1 is ten times S2.

The capacitances of the first photoelectric conversion region 121 and second photoelectric conversion region 122 are preferably equal according to Expressions (5) and (6). The capacitance of the photoelectric conversion portions can be decided by the cubic content of the photoelectric conversion portions and the doping concentration of the photoelectric conversion portions, as described in the fourth embodiment.

A case of making the capacitance of the first photoelectric conversion region 121 and the second photoelectric conversion region 122 to be the same will be described regarding the configuration in FIGS. 2A through 2C. A case will be considered, for example, where the lengths of the first photoelectric conversion portion and second photoelectric conversion portion in the first direction (Y direction) are longer than the length of the second photoelectric conversion portion, and the lengths of the first photoelectric conversion portion and the second photoelectric conversion portion in the second direction (X direction) are the same. In this case, C1=C2 can be realized by making at least one of the doping depth and doping concentration of the first photoelectric conversion portion 123 and second photoelectric conversion portion 124 making up the first photoelectric conversion region 121 to be deeper/higher than that of the second photoelectric conversion region 122.

Next, a case will be considered where the doping concentrations and doping depths of the first photoelectric conversion portion 123 and second photoelectric conversion portion 124 making up the first photoelectric conversion region 121, and of the second photoelectric conversion region 122, are the same.

The first photoelectric conversion region 121 is provided with the second barrier region 127 to electrically separate the first photoelectric conversion portion 123 and the second photoelectric conversion portion 124. On the other hand, the second photoelectric conversion region 122 is configured as a single photoelectric conversion portion, and no barrier region is provided therein. Accordingly, the fact that the lengths of the photoelectric conversion portions in the X direction are shorter than the length of the second photoelectric conversion region 122 in the X direction needs to be taken into account when considering the capacitance of the first photoelectric conversion region 121. Accordingly, C1=C2 can be achieved by making the lengths of the first and second photoelectric conversion portions in the Y direction to be longer than the length of the second photoelectric conversion region 122, or making the length of the first photoelectric conversion region 121 in the X direction to be longer than the length of the second photoelectric conversion region 122. However, the later case is more preferable, since an arrangement where the depths and doping concentrations of the multiple photoelectric conversion portions 124 are the same enables the photoelectric conversion portions to be formed under the same ion implantation conditions, thus facilitating the manufacturing process.

As described above, any of the solid-state imaging devices described in the first through third embodiments can be used in the present embodiment. However, the arrangement illustrated in FIGS. 2A through 2C is advantageous in a case where, of the first photoelectric conversion region 121 and second photoelectric conversion region 122, the first photoelectric conversion region 121 including the multiple photoelectric conversion portions (first photoelectric conversion portion 123 and second photoelectric conversion portion 124 for acquiring ranging signals) has a higher sensitivity than the second photoelectric conversion region 122, since measuring signals can be acquired at high speed while acquiring imaging signals that have different sensitivities from each other.

Figure 16:
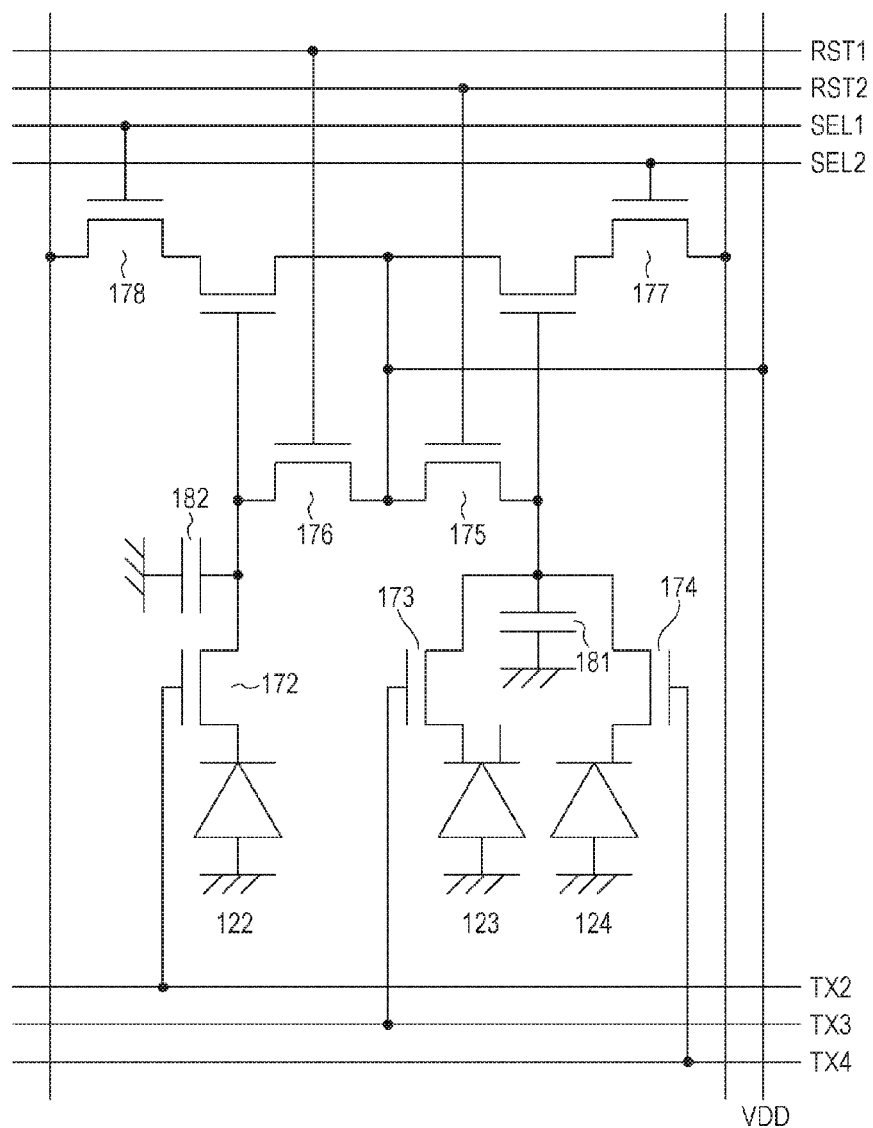
FIG. 16 is a circuit diagram applicable to pixels in the first and second embodiments.

FIG. 16 is a circuit diagram applicable to the pixels 101, 201, 202, 203, 301, 302, 303, 401, and 501 in the solid-state imaging device according to the present invention. The circuit diagram illustrated in FIG. 16 is what is called a "4-Tr pixel configuration", the basic operation flow being the same as that of a common 4-Tr pixel configuration. However, the point that multiple photoelectric conversion portions are included in a single pixel differs from a common 4-Tr pixel configuration. Signal detection operations will be described with reference to FIG. 16.

First, reset transistors (RST) 175 and 176 and transfer transistors (TX) 172, 173, and 174 are sequentially turned on by horizontal driving lines from the upper row of the solid-state imaging device 100 (e.g., see FIG. 1). Accordingly, the second photoelectric conversion region 122, first photoelectric conversion portion 123, and second photoelectric conversion portion 124 are reset, along with in-pixel memory (FD) 181 and 182 connected thereto. The FD 181 is shared between the first photoelectric conversion portion 123 and second photoelectric conversion portion 124, and the FD 182 is connected to the second photoelectric conversion region 122. Next, the TX 172, 173, and 174 are sequentially turned off from the upper row of the solid-state imaging device 100, and charge accumulation to the second photoelectric conversion region 122, first photoelectric conversion portion 123, and second photoelectric conversion portion 124 starts.

While charge accumulation is being performed, dark level signals for performing correlated double sampling are read out beforehand. Specifically, after the RST 175 and 176 are turned off, selection transistors (SEL) 177 and 178 are sequentially turned on from the upper row of the solid-state imaging device 100, and the dark level of the FD 181 and 182 are transferred to the peripheral circuits 104.

After having performed charge accumulation for a predetermined amount of exposure time, signal detection operations are performed. First, operations for acquiring signals according to the charges accumulated in the second photoelectric conversion region 122 (pixel signals) will be described. The TX 172 is sequentially turned on from the upper row of the solid-state imaging device 100, and the charge accumulated in the second photoelectric conversion region 122 is transferred to the FD 182. After the TX 172 is turned off, the SEL 178 is sequentially turned on from the upper row of the solid-state imaging device 100, and a voltage signal is transferred to the peripheral circuits 104. In this case, the voltage signal transferred to the peripheral circuits 104 is the sum of the charge transferred from the second photoelectric conversion region 122 to the FD 182 and the dark level signal. The difference between the voltage signal transferred to the peripheral circuits 104 (the sum of the pixel signal and dark level signal) and the dark level signal transferred to the peripheral circuits 104 beforehand is calculated, whereby just the pixel signal according to the charge accumulated in the second photoelectric conversion region 122 can be acquired. Thus, a pixel signal having low sensitivity and a long exposure time can be acquired.

Next, two techniques will be described regarding operations for acquiring the signals (pixel signal) of the charges accumulated in the first photoelectric conversion portion 123 and second photoelectric conversion portion 124. Either of the two techniques may be used. Alternatively, the two techniques may be selectively used as suitable, as two modes (a first mode and a second mode) in accordance with the demanded ranging precision and image quality, as described later. These two modes may be automatically selected by a mode selecting unit included in a later-described imaging apparatus 190 (realized by a central processing unit (CPU) 192), or may be manually selectable.

The first technique (first mode) is a technique to separately read out signals (pixel signals) accumulated in the first photoelectric conversion portion 123 and second photoelectric conversion portion 124. The TX 173 is sequentially turned on from the upper row of the solid-state imaging device 100 (e.g., see FIG. 1), and the charge accumulated in the first photoelectric conversion portion 123 is transferred to the FD 181. After the TX 173 is turned off, the SEL 177 is sequentially turned on from the upper row of the solid-state imaging device 100, and a voltage signal is transferred to the peripheral circuits 104. Thereafter, the difference between the voltage signal transferred to the peripheral circuits 104 and the dark level signal is calculated, whereby just the pixel signal according to the charge accumulated in the first photoelectric conversion portion 123 can be acquired.

Next, after resetting the charge accumulated in the FD 181 by turning the RST 175 on, the signal of the charge accumulated in the second photoelectric conversion portion 124 is acquired. Specifically, the TX 174 is sequentially turned on from the upper row of the solid-state imaging device 100, and the charge accumulated in the second photoelectric conversion portion 124 is transferred to the FD 181. After the TX 174 is turned off, the SEL 177 is sequentially turned on from the upper row of the solid-state imaging device 100, and a voltage signal is read out. Thereafter, the difference between the voltage signal that has been read out and the dark level signal is calculated, whereby just the pixel signal according to the charge accumulated in the second photoelectric conversion portion 124 can be acquired. A pixel signal with high sensitivity and short time can be acquired by calculating the sum of the pixel signal of the charge accumulated in the first photoelectric conversion portion 123 and the pixel signal of the charge accumulated in the second photoelectric conversion portion 124 by addition of the voltage signals at the peripheral circuits 104.

The second technique (second mode) is to directly read out a signal that is the sum of the charge accumulated in the first photoelectric conversion portion 123 and the charge accumulated in the second photoelectric conversion portion 124. The second technique is the same as the first technique up to acquisition of the charge accumulated in the first photoelectric conversion portion 123. That is to say, the TX 173 is sequentially turned on from the upper row of the solid-state imaging device 100 (e.g., see FIG. 1), and the charge accumulated in the first photoelectric conversion portion 123 is transferred to the FD 181. After the TX 173 is turned off, the SEL 177 is sequentially turned on from the upper row of the solid-state imaging device 100, and a voltage signal is read out. Thereafter, the difference between the voltage signal that has been read out and the dark level signal is calculated, whereby the pixel signal according to the charge accumulated in the first photoelectric conversion portion 123 can be acquired.

Next, with the RST 175 remaining off, the TX 174 is turned on and the charge accumulated in the second photoelectric conversion portion 124 is transferred to the FD 181. A charge which is the sum of the charge accumulated in the first photoelectric conversion portion 123 and the charge accumulated in the second photoelectric conversion portion 124 is accumulated in the FD 181. Accordingly, the SEL 177 is turned on from the upper row of the solid-state imaging device 100, and the voltage signal is read out. Thereafter, the difference between the voltage signal that has been read out and the dark level signal is calculated, whereby the signal of the sum of the charge accumulated in the first photoelectric conversion portion 123 and the charge accumulated in the second photoelectric conversion portion 124 can be acquired. However, the signal of the charge accumulated in the second photoelectric conversion portion 124 cannot be directly read out in this second technique. Accordingly, the difference between the voltage signal of the sum of the pixel signal of the charge accumulated in the first photoelectric conversion portion 123 and the pixel signal of the charge accumulated in the second photoelectric conversion portion 124, and the voltage signal of the charge accumulated in the second photoelectric conversion portion 124, can be calculated by subtraction of the two voltage signals at the peripheral circuits 104.

The first technique directly acquires ranging signals, while the signals for the photography image are obtained by addition of the two voltage signals. On the other hand, the second technique directly acquires signals for the imaging image, while one of the ranging signals is obtained by subtraction of the voltage signals. Generally, the sound-to-noise ratio of the signals deteriorates by performing addition or subtraction of two voltage signals, so the first technique has high quality regarding signals for ranging, and the second technique has high quality regarding signals for the photography image. Accordingly, the first technique is more preferable if high ranging precision is demanded, while the second technique is more preferable if high image quality is demanded. Although a case has been illustrated where the charge accumulated in the first photoelectric conversion portion 123 is transferred to the FD first, an arrangement may be made where the charge accumulated in the second photoelectric conversion portion 124 is transferred to the FD first.

The exposure time of the second photoelectric conversion region 122 (charge accumulation time) is the time from the TX 172 going off till going on. In the same way, the exposure times of the first photoelectric conversion portion 123 and second photoelectric conversion portion 124 (charge accumulation time) respectively are the time from the TX 173 going off till going on and the time from the TX 174 going off till going on. The exposure times of the first photoelectric conversion portion 123 and second photoelectric conversion portion 124 are equal in the fifth embodiment.

Figure 17:
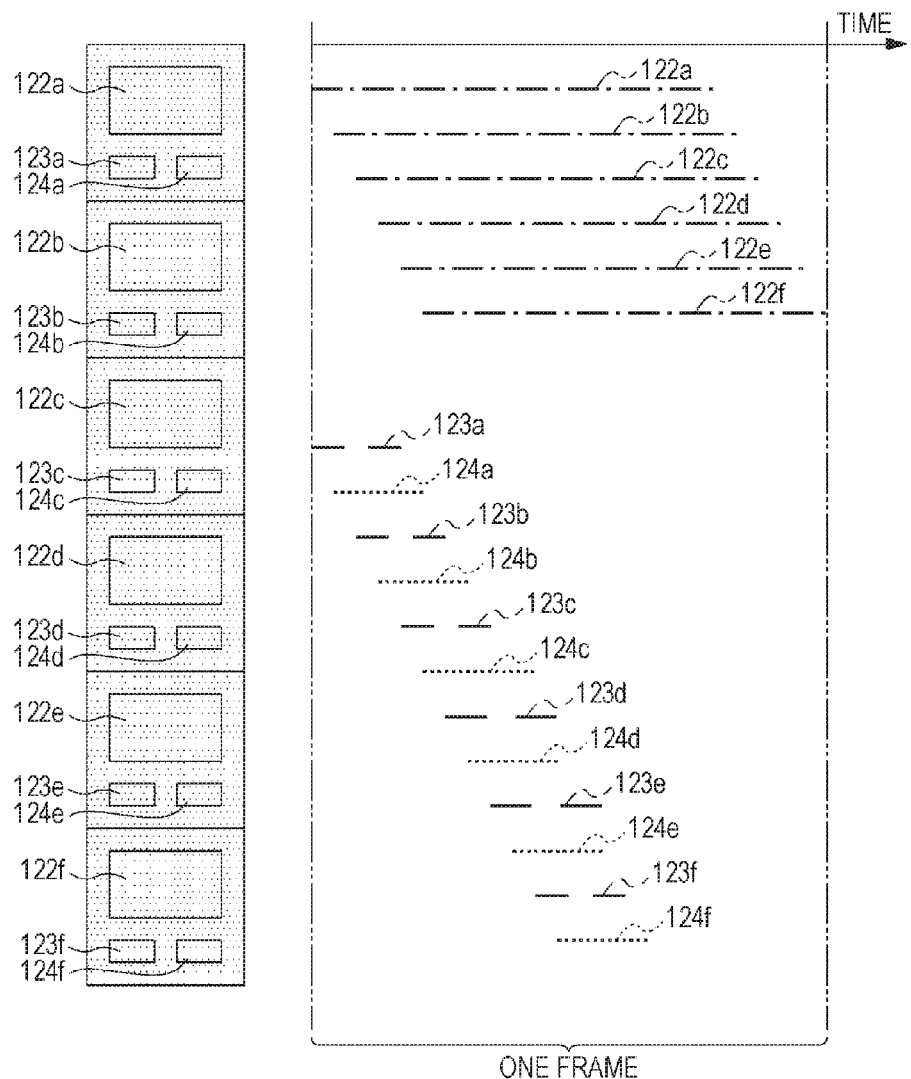
FIG. 17 is a diagram illustrating exposure times of multiple pixels arrayed in the same column, in a case where the sensitivity of a first photoelectric conversion region is higher than that of a second photoelectric conversion region.
Figure 18:
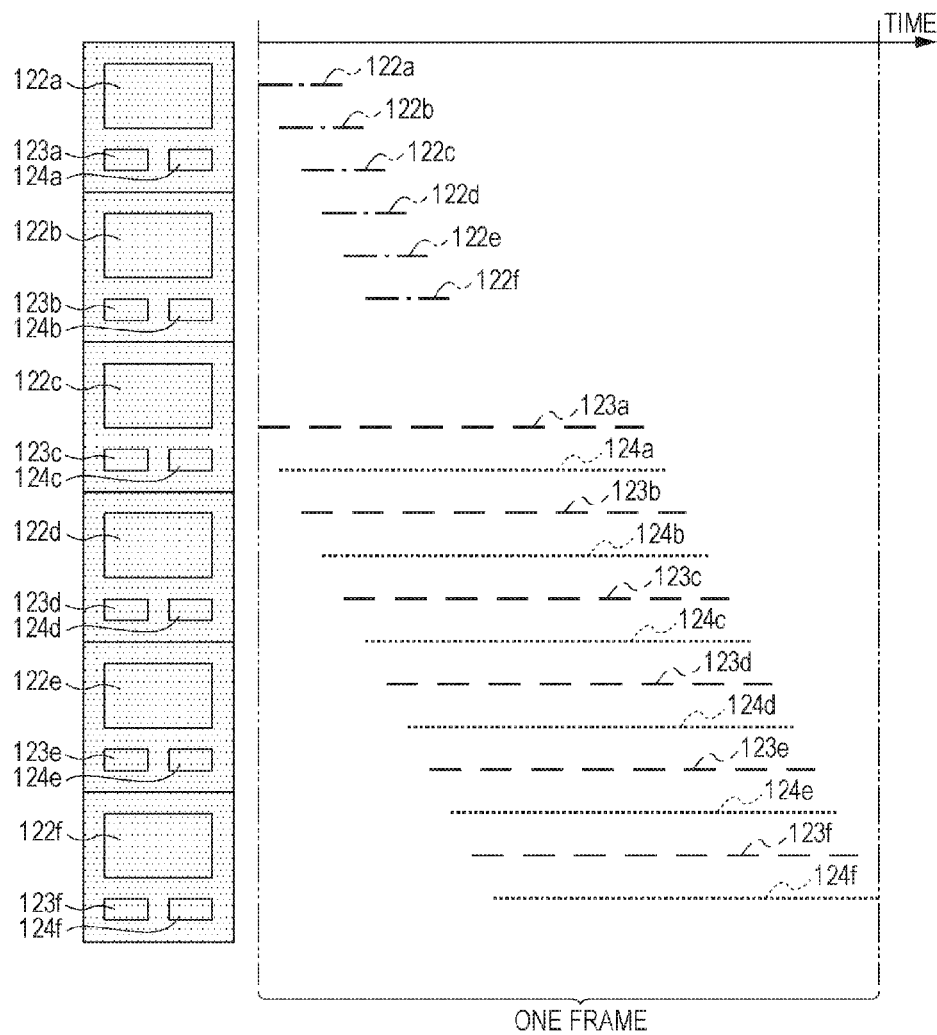
FIG. 18 is a diagram illustrating exposure times of multiple pixels arrayed in the same column, in a case where the sensitivity of a first photoelectric conversion region is lower than that of a second photoelectric conversion region.

FIGS. 17 and 18 are drawings illustrating the exposure times of multiple pixels in the same column. FIG. 17 illustrates a case where the sensitivity of the first photoelectric conversion region 121, where the first photoelectric conversion portion 123 and second photoelectric conversion portion 124 are provided, is higher than the sensitivity of the second photoelectric conversion region 122 (122a through 122f), and FIG. 18 illustrates a case where the sensitivity of the first photoelectric conversion region 121 is lower than the sensitivity of the second photoelectric conversion region 122 (a case where the pixel 501 illustrated in FIGS. 10A through 10C is disposed in the center region 102 of the solid-state imaging device 100. The first photoelectric conversion region 121 and second photoelectric conversion region 122 differ with regard to sensitivity, so the length of exposure time differs. It can be seen from FIG. 17 that the arrangement in FIG. 17 allows ranging and photography image signals to be acquired in a shorter time than the arrangement in FIG. 18. The reason for this can be understood as follows.

As described above, the signals read out by the signal line connected to the FD 181 are the two types of signals of charges accumulated in the first photoelectric conversion portion 123 (123a through 123f) and signals of charges accumulated in the second photoelectric conversion portion 124 (124a through 124f). On the other hand the signals read out by the signal line connected to the FD 182 is the one type of the signals of charges accumulated in the second photoelectric conversion region 122. Accordingly, the readout time by the signal line connected to the FD 181 is longer than the readout time by the signal line connected to the FD 182, and is approximately twice the time of the signal line connected to the FD 182. Now, reading out the signals of the charges accumulated in the first photoelectric conversion portion 123 and signals of the charges accumulated in the second photoelectric conversion portion 124 by separate signal lines would reduce readout time, but this would increase the number of necessary transistors and signal lines. This would lead to disadvantageous results such as the aperture ratio being smaller, and the cost of manufacturing increasing.

In a case where the exposure time of the first photoelectric conversion region 121 is shorter than the exposure time of the second photoelectric conversion region 122, signal readout operations from the time-consuming first photoelectric conversion portion 123 and second photoelectric conversion portion 124 can be performed before exposure of the second photoelectric conversion region 122 is completed, as illustrated in FIG. 17. Accordingly, the amount of time for acquiring pixel signals can be reduced. In a case where the exposure time of the first photoelectric conversion region 121 is longer than the exposure time of the second photoelectric conversion region 122, signal readout operations from the time-consuming first photoelectric conversion portion 123 and second photoelectric conversion portion 124 have to be performed after exposure of the second photoelectric conversion region 122 is completed. This makes the time for acquiring pixel signals longer.

Thus, in a case where the exposure time of the first photoelectric conversion region 121 is shorter than the exposure time of the second photoelectric conversion region 122, the time for acquiring signals can be reduced even further. That is to say, in a case where the sensitivity of the first photoelectric conversion region 121 including multiple photoelectric conversion portions is higher than the sensitivity of the second photoelectric conversion region 122, ranging signals can be acquired at high speed while acquiring imaging signals having different sensitivities.

This is advantageous when acquiring a moving image from the first photoelectric conversion region 121 and a still image from the second photoelectric conversion region 122, since the reduced signal acquisition time enables the speed of burst shots of still images to be improved. This is also advantageous when acquiring a still image from the first photoelectric conversion region 121 and a moving image from the second photoelectric conversion region 122, since the reduced signal acquisition time enables the frame rate of the moving image to be increased.

Particularly, a case where the exposure time of the first photoelectric conversion region 121 is equal to or shorter than half the exposure time of the second photoelectric conversion region 122 is even more preferable, since the exposure and readout operations of the first photoelectric conversion region 121 can be completed during exposure of the second photoelectric conversion region 122.

Sixth Embodiment

Figure 12:
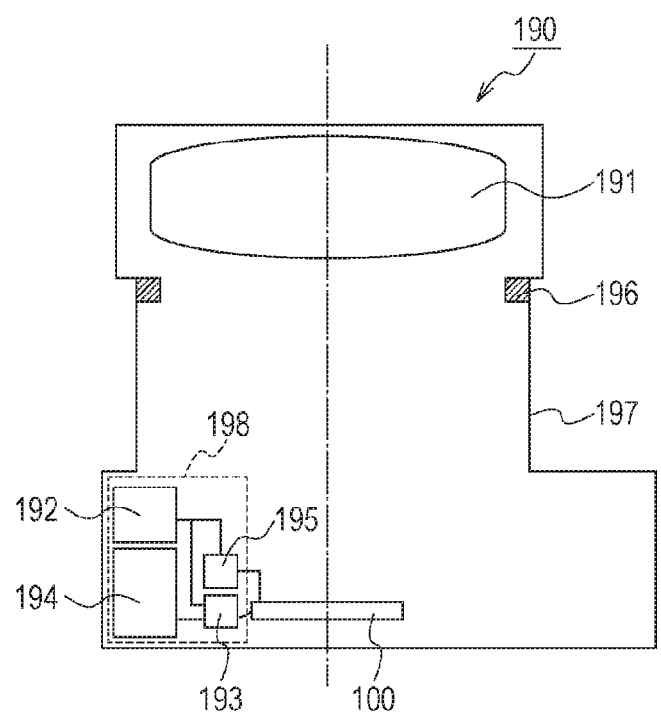
FIG. 12 is a schematic diagram illustrating an example of an imaging apparatus provided with a solid-state imaging device according to a sixth embodiment.

FIG. 12 is a schematic diagram of an imaging apparatus 190 having the solid-state imaging device 100 according to the present invention. The imaging apparatus 190 has a housing 197 having a lens attachment portion 196 for attaching a photographing lens 191, the housing 197 including the solid-state imaging device 100 and a control unit 198 that controls the operations of the imaging apparatus 190. The photographing lens 191 is attached to the housing 197 by the lens attachment portion 196. The imaging apparatus 190 may be an interchangeable-lens configuration enables the photographing lens 191 to be removed from the housing 197 and exchanged, or not. The control unit 198 includes the CPU 192, a transfer circuit 193, a signal processing unit 194, and a pixel drive circuit 195.

The CPU 192 is a circuit that controls the transfer circuit 193, signal processing unit 194, and pixel drive circuit 195. The pixel drive circuit 195 is a circuit that drives the solid-state imaging device 100 under signals from the CPU 192, and controls the exposure time of photoelectric conversion portions and the readout timing of signals acquired at the photoelectric conversion portions, for example. The transfer circuit 193 stores signals read out from the solid-state imaging device 100, and transfers the signals to the signal processing unit 194. The signal processing unit 194 performs image processing on signals acquired via the transfer circuit 193.

The solid-state imaging device 100 outputs the signals acquired at each of the first photoelectric conversion portion 123, second photoelectric conversion portion 124, and second photoelectric conversion region 122 to the transfer circuit 193, and the signals output to the transfer circuit 193 are transmitted to the signal processing unit 194.

Under control of the CPU 192, the signal processing unit 194 detects the distance to a subject, and generates an image of the subject, from the signals acquired at the photoelectric conversion portions. An example of the imaging apparatus 190 having the solid-state imaging device 100 having the pixel 101 illustrated in FIGS. 2A through 2C will be described as an example.

First, a case where the CPU 192 outputs signals to generate an image with a wide dynamic range will be described. In this case, the pixel drive circuit 195 operates so that the exposure times of the first photoelectric conversion portion 123, second photoelectric conversion portion 124, and second photoelectric conversion region 122 are equal to each other.

The signal processing unit 194 adds the signals acquired at the first photoelectric conversion portion 123 and the signals acquired at the second photoelectric conversion portion 124, and acquires high-sensitivity signals. The signals acquired at the second photoelectric conversion region 122 are acquired as low-sensitivity signals. In a case where the amount of light entering the pixel is equal to or lower than a threshold value determined beforehand, the high-sensitivity signals are used, and if higher than the threshold value, the low-sensitivity signals are used, with the two being synthesized and an image with a wide dynamic range being formed. Further, the signal processing unit 194 compares the ranging image generated from the signals acquired at the first photoelectric conversion portion 123 with the ranging image generated from the signals acquired at the second photoelectric conversion portion 124, and calculates the distance to the subject.

Next, a case where the CPU 192 outputs signals to generate a moving image and still image at the same time will be described. In this case, the pixel drive circuit 195 operates so that the exposure times of the first photoelectric conversion portion 123 and second photoelectric conversion portion 124 are shorter than the exposure time of the second photoelectric conversion region 122.

The signal processing unit 194 adds the signals acquired at the first photoelectric conversion portion 123 and the signals acquired at the second photoelectric conversion portion 124, and acquires high-sensitivity signals. The signals acquired at the second photoelectric conversion region 122 are acquired as low-sensitivity signals. A still image is generated from the high-sensitivity signals, and a moving image is generated from the low-sensitivity signals. Further, the signal processing unit 194 compares a ranging image generated from the signals acquired at the first photoelectric conversion portion 123 with a ranging image generated from the signals acquired at the second photoelectric conversion portion 124, and calculates the distance to the subject. The imaging apparatus 190 may perform autofocus using the calculated distance. In this case, the distance to the subject can be calculated without reducing the frame rate of the moving image being acquired, by acquiring ranging images along with the still image at the second photoelectric conversion portions having high sensitivity and short exposure time.

The imaging apparatus 190 may be an apparatus that has a wide dynamic range mode to form images with a wide dynamic range, and a moving-still image simultaneous acquisition mode to acquire a moving image and a still image at the same time, where the user can select either mode. In a case where the wide dynamic range mode is selected, the CPU 192 outputs signals to generate an image with a wide dynamic range, and in a case where the moving-still image simultaneous acquisition mode is selected, outputs signals to generate a moving image and still image at the same time. These two modes may be automatically selected by a mode selecting unit included in the imaging apparatus 190 (realized by the CPU 192), or may be manually selectable.

In a case where the wide dynamic range mode is selected, the signal processing unit 194 generates an image of the subject using the signals with relatively high sensitivity in a case where the amount of light entering the pixel is equal to or lower than a predetermined threshold value, and generates an image using the signals with relatively low sensitivity in a case where the amount of light entering the pixel exceeds the threshold value. On the other hand, in a case where the moving-still image simultaneous acquisition mode is selected, the signal processing unit 194 generates one of the still image and moving image using the signals acquired at the first photoelectric conversion region 121, and generates the other image using the signals acquired at the second photoelectric conversion region 122.

Accordingly, in a case where the imaging apparatus 190 has the wide dynamic range mode and the moving-still image simultaneous acquisition mode, the solid-state imaging device 100 needs to have a configuration suitable for both. Accordingly, the sensitivity and capacitance of each of the first photoelectric conversion region 121 and second photoelectric conversion region 122 is designed to satisfy at least Expression (4). Further satisfying Expressions (5) and (6) is even more preferable.

According to the present invention, ranging signals can be acquired while acquiring imaging signals having different sensitivities from each other, and also preventing ranging precision from deteriorating.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-048506, filed Mar. 11, 2015, and Japanese Patent Application No. 2016-018366, filed Feb. 2, 2016, which are hereby incorporated by reference herein in their entirety.

What is claimed is:

1. A pixel comprising:
 a first photoelectric conversion region and a second photoelectric conversion region that have different sensitivities from each other and are arrayed in parallel in a first direction;
 a first barrier region that is sandwiched between the first photoelectric conversion region and the second photoelectric conversion region,
 wherein the first photoelectric conversion region includes:
   a first photoelectric conversion portion and a second photoelectric conversion portion arrayed in parallel in a second direction that intersects the first direction, and
   a second barrier region sandwiched between the first photoelectric conversion portion and the second photoelectric conversion portion,
 and wherein a magnitude of electrical separation of the first barrier region is larger than a magnitude of electrical separation of the second barrier region; and
 a microlens at the light entry side of the first photoelectric conversion region and the second photoelectric conversion region,
 wherein the microlens has a refractive index distribution that is asymmetrical as to a plane perpendicular to the first direction and includes the optical axis of the microlens.

2. The pixel according to claim 1, wherein the magnitude of electrical separation of the first barrier region is larger than the magnitude of electrical separation of the second barrier region due to a height of a potential barrier of the first barrier region being higher than a height of a potential barrier of the second barrier region.

3. The pixel according to claim 1, wherein an amount of offset of an optical axis of the microlens as to a center of the first barrier region in the first direction is larger than an amount of offset of the optical axis of the microlens as to a center of the second barrier region in the second direction.

4. The pixel according to claim 1, wherein the first photoelectric conversion region has a first sensitivity, and the second photoelectric conversion region has a second sensitivity that is lower than the first sensitivity.

5. The pixel according to claim 1, wherein the angle between the first direction and the second direction is a perpendicular angle.

6. The pixel according to claim 1
 wherein the microlens has a shape that is asymmetrical as to a plane perpendicular to the first direction and includes the optical axis of the microlens.

7. The pixel according to claim 1
 wherein the refractive force of the microlens in the first direction is smaller than the refractive force in the second direction.

8. The pixel according to claim 1, wherein the second photoelectric conversion region includes:
 a third photoelectric conversion portion and a fourth photoelectric conversion portion, arrayed in parallel in the second direction.

9. The pixel according to claim 1, wherein a charge accumulation time of the first photoelectric conversion region is half or less than a charge accumulation time of the second photoelectric conversion region.

10. A solid-state imaging device comprising a plurality of pixels, wherein each of the pixels is a pixel according to claim 1.

11. An imaging apparatus comprising:
 a photographing lens; and
 the solid-state imaging device according to claim 10.

12. The imaging apparatus according to claim 11, wherein an image of a subject is generated by:
 using signals that have relatively high sensitivity in a case where an amount of light entering the pixel is equal to or lower than a predetermined threshold value, and
 using signals that have relatively low sensitivity in a case where an amount of light entering the pixel exceeds the predetermined threshold value.

13. The imaging apparatus according to claim 11, wherein selection can be made between
 a wide dynamic range mode where an image with a wide dynamic range is formed, and
 a moving-still image simultaneous acquisition mode where a moving image and a still image are acquired simultaneously,
 wherein, in a case where the wide dynamic range mode is selected, an image of a subject is generated by
 using signals that have relatively high sensitivity in a case where an amount of light entering the pixel is equal to or lower than a predetermined threshold value, and using signals that have relatively low sensitivity in a case where an amount of light entering the pixel exceeds the predetermined threshold value, and wherein, in a case where the moving-still image simultaneous acquisition mode is selected, one of a still image and moving image is generated using signals acquired at the first photoelectric conversion region, and the other image is generated using signals acquired at the second photoelectric conversion region.

14. The imaging apparatus according to claim 11, further comprising:

a mode selecting unit capable of selecting between a first mode and a second mode, wherein, in a case that the first mode is selected by the mode selecting unit, signals are acquired where a charge accumulated at the first photoelectric conversion portion and a charge accumulated at the first photoelectric conversion portion have been added, and wherein, in a case that the second mode is selected by the mode selecting unit, signals are acquired separately from a charge accumulated at the first photoelectric conversion portion and a charge accumulated at the first photoelectric conversion portion.

15. A pixel comprising:

a first photoelectric conversion region and a second photoelectric conversion region that have different sensitivities from each other and are arrayed in parallel in a first direction;

a first barrier region that is sandwiched between the first photoelectric conversion region and the second photoelectric conversion region, wherein the first photoelectric conversion region includes:

a first photoelectric conversion portion and a second photoelectric conversion portion arrayed in parallel in a second direction that intersects the first direction, and a second barrier region sandwiched between the first photoelectric conversion portion and the second photoelectric conversion portion, and wherein a magnitude of electrical separation of the first barrier region is larger than a magnitude of electrical separation of the second barrier region;

a microlens at the light entry side of the first photoelectric conversion region and the second photoelectric conversion region; and an optical waveguide at an exit side of the microlens, wherein an amount of offset of a center of an exit side of a core of the optical waveguide as to the center of the first barrier region in the first direction is larger than an amount of offset of the center of the exit side of the core of the optical waveguide as to the center of the second barrier region in the second direction.

16. The pixel according to claim 15, wherein the magnitude of electrical separation of the first barrier region is larger than the magnitude of electrical separation of the second barrier region due to a height of a potential barrier of the first barrier region being higher than a height of a potential barrier of the second barrier region.

17. The pixel according to claim 15 wherein an amount of offset of an optical axis of the microlens as to a center of the first barrier region in the first direction is larger than an amount of offset of the optical axis of the microlens as to a center of the second barrier region in the second direction.

18. The pixel according to claim 15, wherein the first photoelectric conversion region has a first sensitivity, and the second photoelectric conversion region has a second sensitivity that is lower than the first sensitivity.

19. The pixel according to claim 15, wherein the angle between the first direction and the second direction is a perpendicular angle.

20. The pixel according to claim 15 wherein the microlens has a shape that is asymmetrical as to a plane perpendicular to the first direction and includes the optical axis of the microlens.

21. A solid-state imaging device comprising a plurality of pixels, wherein each of the pixels is a pixel according to claim 15.

22. An imaging apparatus comprising:

a photographing lens; and the solid-state imaging device according to claim 21.

23. The imaging apparatus according to claim 22, wherein an image of a subject is generated by:

using signals that have relatively high sensitivity in a case where an amount of light entering the pixel is equal to or lower than a predetermined threshold value, and using signals that have relatively low sensitivity in a case where an amount of light entering the pixel exceeds the predetermined threshold value.

* * * * *